(12) United States Patent
Kim et al.

(10) Patent No.: US 12,002,815 B2
(45) Date of Patent: Jun. 4, 2024

(54) DISPLAY DEVICE AND METHOD OF MANUFACTURING THE DISPLAY DEVICE

(71) Applicant: SAMSUNG DISPLAY CO., LTD., Yongin-si (KR)

(72) Inventors: Jihyun Kim, Yongin-si (KR); Taewook Kang, Yongin-si (KR); Byungsoo So, Yongin-si (KR); Hyuneok Shin, Yongin-si (KR); Wooseok Jeon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/339,149

(22) Filed: Jun. 4, 2021

(65) Prior Publication Data

US 2022/0093649 A1 Mar. 24, 2022

(30) Foreign Application Priority Data

Sep. 21, 2020 (KR) .................. 10-2020-0121784

(51) Int. Cl.
*H01L 27/12* (2006.01)
*H01L 23/00* (2006.01)
(Continued)

(52) U.S. Cl.
CPC ............ *H01L 27/124* (2013.01); *H01L 24/05* (2013.01); *H01L 27/1218* (2013.01); *H01L 27/1266* (2013.01); *H01L 24/08* (2013.01); *H01L 24/32* (2013.01); *H01L 24/80* (2013.01); *H01L 24/83* (2013.01); *H01L 25/167* (2013.01); *H01L 27/156* (2013.01); *H01L 2224/05541* (2013.01);
(Continued)

(58) Field of Classification Search
None
See application file for complete search history.

(56) References Cited

U.S. PATENT DOCUMENTS 9,450,196 B2 9/2016 Kim et al.
10,824,256 B2 11/2020 Choi et al.
(Continued)

FOREIGN PATENT DOCUMENTS

JP 2017-134382 8/2017
KR 10-2015-0026709 3/2015
(Continued)

*Primary Examiner* — Telly D Green
(74) *Attorney, Agent, or Firm* — Lewis Roca Rothgerber Christie LLP

(57) ABSTRACT

A display device including a display area and a non-display area further includes a base layer including a first surface and a second surface opposite to the first surface, the base layer having, in the non-display area, an opening portion penetrating the first surface and the second surface; a pad unit including a terminal on the first surface, the pad unit extending from the first surface to the opening portion; a connection line connected to the terminal on the first surface, the connection line extending from the non-display area to the display area; an insulating layer covering the terminal and the connection line; a thin-film transistor including a semiconductor layer on the insulating layer, the thin-film transistor being connected to the connection line; and a display element connected to the thin-film transistor, the display element being in the display area.

11 Claims, 32 Drawing Sheets

(51) Int. Cl.
  *H01L 25/16* (2023.01)
  *H10K 59/131* (2023.01)
  *H01L 27/15* (2006.01)

(52) U.S. Cl.
  CPC ............... *H01L 2224/05571* (2013.01); *H01L 2224/08225* (2013.01); *H01L 2224/32225* (2013.01); *H01L 2224/80203* (2013.01); *H01L 2224/80801* (2013.01); *H01L 2224/83203* (2013.01); *H01L 2224/83851* (2013.01); *H10K 59/131* (2023.02)

(56) References Cited

U.S. PATENT DOCUMENTS

| | | | |
|---|---|---|---|
| 11,183,547 B2 * | 11/2021 | Baek | H01L 27/124 |
| 11,239,300 B2 * | 2/2022 | Lee | H10K 77/111 |
| 2014/0117342 A1 * | 5/2014 | Kwon | H10K 59/8731 257/40 |
| 2016/0233289 A1 * | 8/2016 | Son | H01L 27/326 |
| 2017/0025444 A1 | 1/2017 | Hirakata | |
| 2017/0170206 A1 * | 6/2017 | Lee | H01L 27/1218 |
| 2018/0247994 A1 * | 8/2018 | Seo | H01L 27/1218 |
| 2020/0119116 A1 | 4/2020 | Kim et al. | |
| 2020/0127073 A1 | 4/2020 | Ke et al. | |
| 2020/0168688 A1 * | 5/2020 | Lee | H10K 77/111 |
| 2020/0373378 A1 | 11/2020 | Kwon et al. | |
| 2021/0013278 A1 * | 1/2021 | Baek | H01L 27/3262 |
| 2022/0123085 A1 * | 4/2022 | Lee | H10K 59/124 |

FOREIGN PATENT DOCUMENTS

| | | |
|---|---|---|
| KR | 10-2017-0050653 | 5/2017 |
| KR | 10-2019-0048642 | 5/2019 |
| KR | 10-2049735 | 11/2019 |
| KR | 10-2020-0083713 | 7/2020 |

* cited by examiner

DISPLAY DEVICE AND METHOD OF MANUFACTURING THE DISPLAY DEVICE

CROSS-REFERENCE TO RELATED APPLICATION

This application claims priority to and the benefit of Korean Patent Application No. 10-2020-0121784, filed on Sep. 21, 2020 in the Korean Intellectual Property Office (KIPO), the entire disclosure of which is incorporated by reference herein.

BACKGROUND

1. Field

One or more embodiments relate to a display device and a method of manufacturing the display device.

2. Description of Related Art

A display device may include a display area that displays an image and a non-display area that does not display an image. Recently, research has been actively conducted into expanding a display area by reducing the area of a non-display area in which a printed circuit board or the like of a display device is arranged.

A base layer including resins may be used to form a display device. Because the base layer is flexible, handling the same in a manufacturing operation may not be easy. Accordingly, after a base layer is formed on a support substrate having sufficient rigidity and several operations have been performed, an operation of separating the base layer from the support substrate may be performed.

SUMMARY

Aspects of one or more embodiments are directed towards a display device in which a non-display area is reduced and a display area is enlarged by arranging a printed circuit board on a rear surface of a base layer.

Aspects of one or more embodiments are directed towards a method of manufacturing a display device in which a terminal arranged in an opening portion of a base layer is separated from a support substrate.

Additional aspects will be set forth in part in the description which follows and, in part, will be apparent from the description, or may be learned by practice of the presented embodiments of the disclosure.

According to one or more embodiments, a display device including a display area and a non-display area further includes a base layer including a first surface and a second surface opposite to the first surface, the base layer having, in the non-display area, an opening portion penetrating the first surface and the second surface, a pad unit including a terminal on the first surface, the pad unit extending from the first surface to the opening portion, a connection line connected to the terminal on the first surface, the connection line extending from the non-display area to the display area, an insulating layer covering the terminal and the connection line, a thin-film transistor including a semiconductor layer on the insulating layer, the thin-film transistor being connected to the connection line, and a display element connected to the thin-film transistor, the display element being in the display area.

According to an embodiment, the thin-film transistor may further include a gate electrode overlapping the semiconductor layer, a source electrode connected to the semiconductor layer, and a drain electrode connected to the semiconductor layer, wherein in the display area, the connection line may be connected to at least one of the gate electrode, the source electrode, or the drain electrode.

According to an embodiment, the display device may further include a middle connection pattern on the insulating layer, wherein in the display area, the middle connection pattern may be connected to the connection line through a contact hole in the insulating layer, and the thin-film transistor may be connected to the middle connection pattern.

According to an embodiment, the display device may include a first thin-film transistor including polysilicon and a second thin-film transistor including an oxide semiconductor, wherein the thin-film transistor is the first thin-film transistor or the second thin-film transistor.

According to an embodiment, each of the insulating layer and the base layer may include a polymer resin.

According to an embodiment, a first distance from the first surface to the second surface may be greater than a second distance from the first surface to a lower surface of the terminal overlapping the opening portion.

According to an embodiment, the display device may further include a pattern layer overlapping the opening portion, the pattern layer being arranged on the lower surface of the terminal.

According to an embodiment, a lower surface of the terminal may coincide with the second surface.

According to an embodiment, the display device may further include a barrier layer between the insulating layer and the base layer.

According to an embodiment, the display device may further include a lower layer on the second surface, the lower layer having a lower opening portion overlapping the opening portion.

According to an embodiment, the display device may further include a printed circuit board on the second surface, and a flexible printed circuit film overlapping the opening portion, the flexible printed circuit film connecting the printed circuit board and the pad unit.

According to one or more embodiments, a method of manufacturing a display device includes forming a lower layer and a pattern layer on a support substrate, forming a base layer on the lower layer and the pattern layer, forming, in the base layer, an opening portion exposing the pattern layer, forming a terminal overlapping the opening portion and covering the pattern layer and a connection line connected to the terminal on the base layer, and separating the base layer from the lower layer.

According to an embodiment, the separating of the base layer from the lower layer may include separating the pattern layer from the terminal.

According to an embodiment, the method may further include separating the pattern layer from the lower layer.

According to an embodiment, the method may further include electrically connecting a flexible printed circuit film to at least one of the terminal or the pattern layer, and electrically connecting a printed circuit board and the flexible printed circuit film.

According to an embodiment, a circuit terminal of the flexible printed circuit film and the at least one of the terminal or the pattern layer may be melted to be directly connected to each other.

According to an embodiment, a circuit terminal of the flexible printed circuit film may be electrically connected to the at least one of the terminal or the pattern layer through an anisotropic conductive film.

According to an embodiment, the method may further include forming an insulating layer covering the terminal and the connection line, forming a thin-film transistor including a semiconductor layer on the insulating layer, and forming a display element connected to the thin-film transistor.

According to one or more embodiments, a method of manufacturing a display device includes forming a lower layer on a support substrate, forming a base layer on the lower layer, forming, in the base layer, an opening portion exposing the lower layer, forming a terminal overlapping the opening portion and a connection line connected to the terminal on the base layer, separating the support substrate from the base layer, and exposing a lower surface of the terminal overlapping the opening portion.

According to an embodiment, the exposing of the lower surface of the terminal may include forming a lower opening portion by etching the lower layer.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
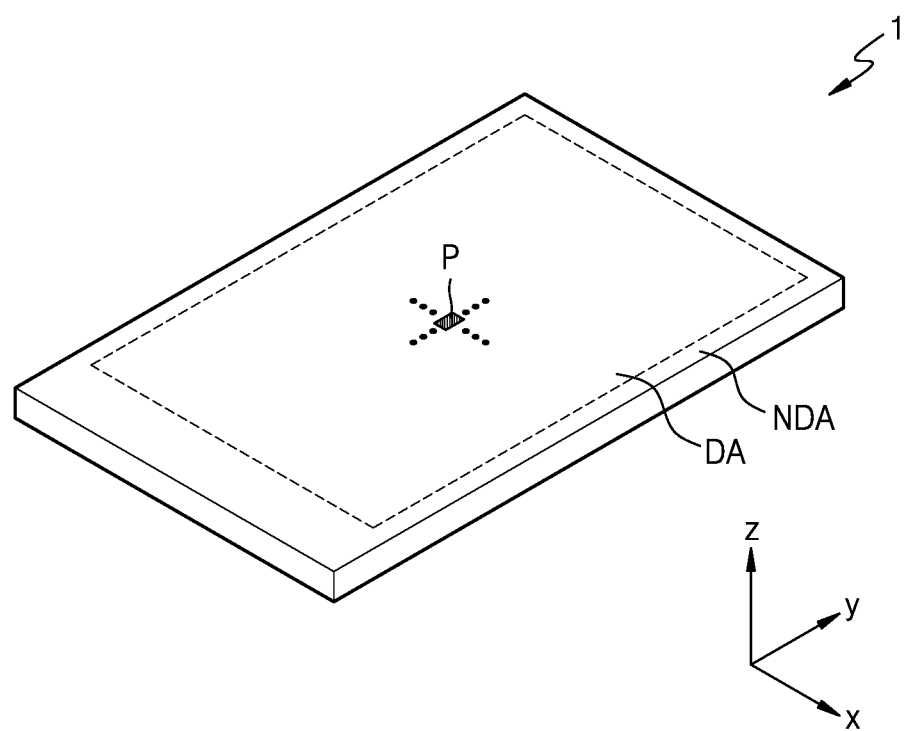
FIG. 1 is a schematic perspective view of a display device according to an embodiment.

Reference will now be made in more detail to embodiments, examples of which are illustrated in the accompanying drawings. Like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, particular embodiments will be illustrated in the drawings and described in more detail in the written description. Effects and features of the present disclosure and methods of achieving the same will be apparent with reference to embodiments and drawings described below in more detail. The present disclosure may, however, be embodied in many different forms and should not be construed as being limited to the embodiments set forth herein.

The present disclosure will now be described more fully with reference to the accompanying drawings, in which embodiments of the present disclosure are shown. Like reference numerals in the drawings denote like elements, and thus their description may be omitted.

While such terms as "first," "second," etc., may be used to describe various elements, such elements must not be limited to the above terms.

In the following embodiments, an expression used in the singular encompasses the expression of the plural, unless the context clearly indicates otherwise.

In the following embodiments, it is to be understood that the terms such as "including," "having," and "comprising" are intended to indicate the existence of the features, or elements disclosed in the present disclosure, and are not intended to preclude the possibility that one or more other features or elements may exist or may be added.

It will be understood that when a layer, region, or component is referred to as being formed on another layer, region, or component, it can be directly or indirectly formed on the other layer, region, or component. That is, for example, intervening layers, regions, or components may be present.

Sizes of components in the drawings may be exaggerated for convenience of explanation. In other words, because sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

It will be understood that when a layer, region, or component is referred to as being connected to another layer, region, or component, it can be directly or indirectly connected to the other layer, region, or component. That is, for example, intervening layers, regions, or components may be present. For example, it will be understood that when a layer, region, or component is referred to as being electrically connected to another layer, region, or component, it can be directly or indirectly electrically connected to the other layer, region, or component. That is, for example, intervening layers, regions, or components may be present.

Further, the use of "may" when describing embodiments of the present disclosure refers to "one or more embodiments of the present disclosure".

In the drawings, the relative sizes of elements, layers, and regions may be exaggerated and/or simplified for clarity. Spatially relative terms, such as "beneath," "below," "lower," "above," "upper," "bottom," "top," and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially," "about," and similar terms are used as terms of approximation and not as terms of degree, and are intended to account for the inherent deviations in measured or calculated values that would be recognized by those of ordinary skill in the art.

A display device may be a device which displays a video or a still image, which may be a portable electronic device, such as a mobile phone, a smart phone, a table personal computer (PC), a mobile communication terminal, an electronic notebook, an electronic book, a portable multimedia player (PMP), a navigation device, an Ultra Mobile PC (UMPC), and/or the like, and may also be used as a display screen of various products, such as a television, a laptop computer, a monitor, an advertisement board, the Internet of things (IoT), and/or the like.

A display device according to an embodiment may be used as a wearable device, such as a smart watch, a watch phone, a glasses-type display, and/or a head mounted display (HMD). In addition, the display device according to an embodiment may be used as a dashboard of a vehicle, a center fascia of a vehicle or a center information display (CID) arranged on a dashboard, a room mirror display replacing a side mirror of a vehicle, and/or a display arranged on a back surface of a front seat as entertainment for a back seat of a vehicle.

The display device according to an embodiment may connect a plurality of display panels to each other to form a large screen such as the advertisement board. Each of a plurality of display panels of a tiled display device in which the plurality of display panels are connected to each other may include a display area and a non-display area surrounding the display area.

FIG. 1 is a schematic perspective view of a display device 1 according to an embodiment.

Referring to FIG. 1, the display device 1 may include a display area DA and a non-display area NDA. A pixel P may be arranged in the display area DA. The display device 1 may provide an image by using light emitted from the pixel P.

In an embodiment, the pixel P may emit red, green, or blue light by using a display element. In an embodiment, the pixel P may emit red, green, blue, or white light by using a display element. As described above, the pixel P of embodiments of the present disclosure may define an emission area of a display element emitting light of one of a color from among red, green, blue, or white.

The non-display area NDA may be an area that does not provide an image. The non-display area NDA may at least partially surround the display area DA. In an embodiment, the non-display area NDA may entirely surround the display area DA. A driver and/or the like configured to provide electrical signals or power to the pixel P may be arranged in the non-display area NDA. In addition, the non-display area NDA may include a pad area in which a pad is arranged.

Figure 2A:
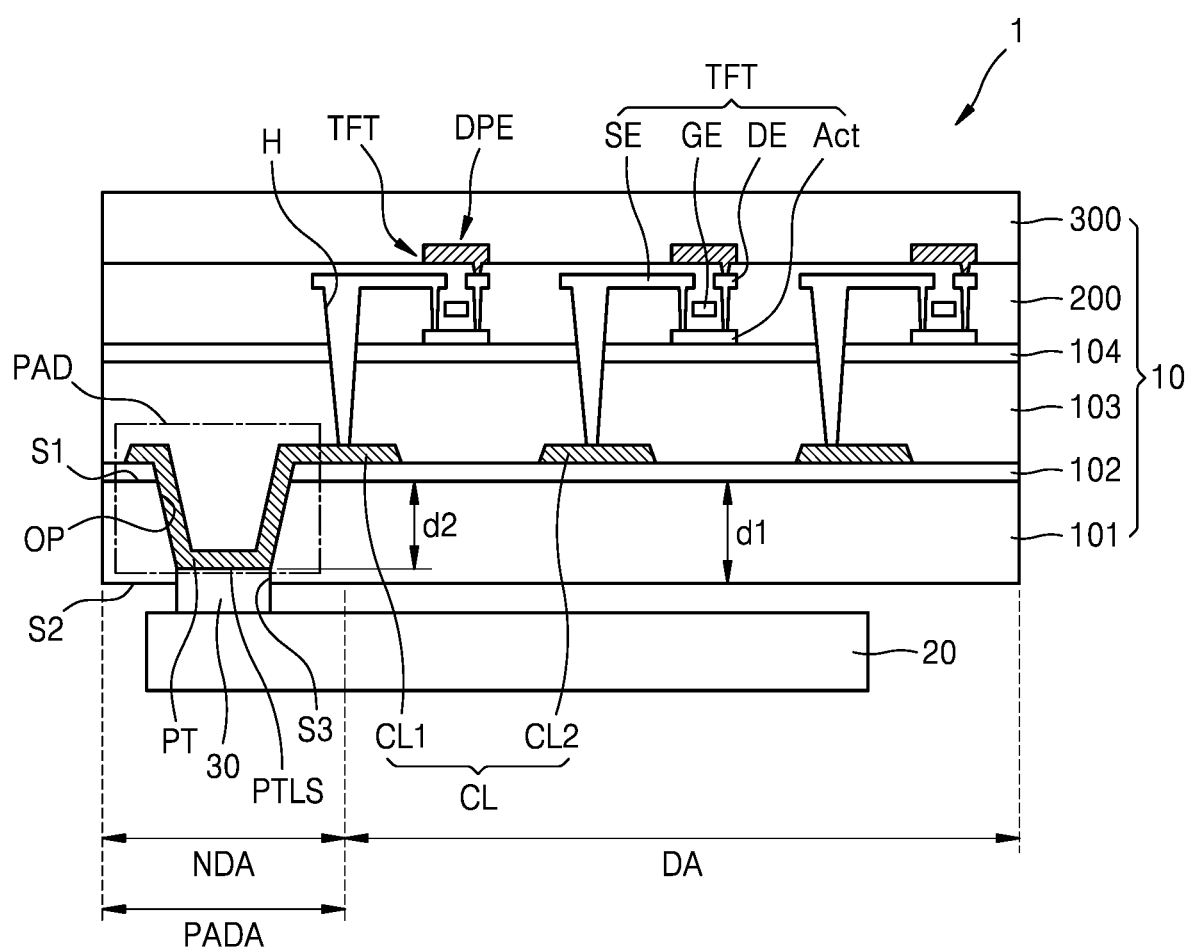
FIGS. 2A and 2B are schematic cross-sectional views of a display device according to one or more embodiments.
Figure 2B:
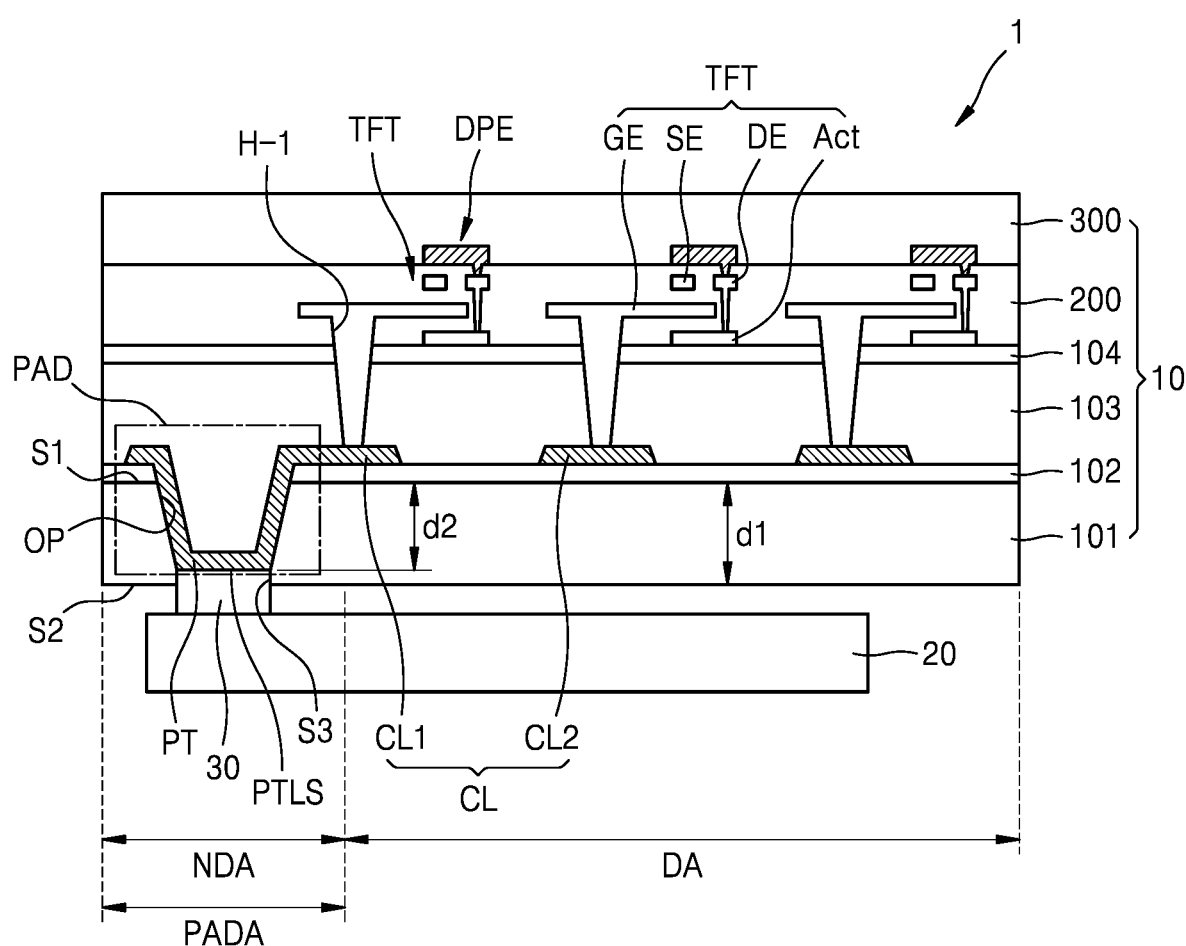

FIGS. 2A and 2B are schematic cross-sectional views of the display device 1 according to one or more embodiments.

Referring to FIGS. 2A and 2B, the display device 1 may include a display panel 10, a printed circuit board 20, and a flexible printed circuit film 30. The display panel 10 may display an image. The display panel 10 may include a base layer 101, a first barrier layer 102, a pad unit PAD, a connection line CL, an insulating layer 103, a second barrier layer 104, a pixel circuit layer 200, a display element DPE, and a protective layer 300.

The base layer 101 may be arranged in the display area DA and the non-display area NDA. The base layer 101 may include a first surface S1 and a second surface S2 opposite to the first surface S1. The first surface S1 may be a surface facing the display element DPE. The second surface S2 may be a surface facing the printed circuit board 20.

The base layer 101 may have an opening portion OP penetrating the first surface S1 and the second surface S2. For example, the opening portion OP may extend through the base layer 101 from the first surface S1 to the second surface S2. The opening portion OP may overlap the non-display area NDA. In particular, the opening portion OP may overlap a pad area PADA.

The base layer 101 may include a polymer resin such as polyethersulphone, polyarylate, polyetherimide, polyethylene naphthalate, polyethylene terephthalate, polyphenylene sulfide, polyimide, polycarbonate, cellulose triacetate, cellulose acetate propionate, and/or the like. The base layer 101 may be flexible, rollable, and/or bendable.

The first barrier layer 102 may be arranged on the base layer 101. The first barrier layer 102 may prevent or reduce penetration of foreign substances. The first barrier layer 102 may be a single layer or multiple layers including an inorganic material such as silicon nitride ($SiN_x$), silicon oxynitride (SiON), and/or silicon oxide ($SiO_2$). In some embodiments, the first barrier layer 102 may be omitted.

The pad unit PAD may be connected (e.g., electrically connected) to the flexible printed circuit film 30. The pad unit PAD may receive control signals and/or power voltages from the printed circuit board 20 and/or the flexible printed circuit film 30.

In an embodiment, the pad unit PAD may include a terminal PT, and the terminal PT may be connected (e.g., electrically connected) to the flexible printed circuit film 30. The terminal PT may be arranged on the first surface S1. In an embodiment, the terminal PT may be arranged on the first barrier layer 102. The terminal PT may extend through the opening portion OP. Accordingly, the terminal PT may overlap the opening portion OP. In an embodiment, the terminal PT may extend in a direction from the first surface S1 to the second surface S2 through the opening portion OP.

A lower surface PTLS of the terminal PT may not coincide with the second surface S2. For example, the lower surface PTLS of the terminal PT may not be aligned with the second surface S2 such that the lower surface PTLS of the terminal PT and the second surface S2 form a step. The lower surface PTLS of the terminal PT may be a surface of the terminal PT, the surface being the closest to the second surface S2. In an embodiment, the lower surface PTLS of the terminal PT overlapping the opening portion OP may be arranged between the first surface S1 and the second surface S2. In an embodiment, a first distance d1 from the first surface S1 to the second surface S2 may be greater than a second distance d2 from the first surface S1 to the lower surface PTLS of the terminal PT. Herein, the first distance d1 may be a thickness of the base layer 101.

The opening portion OP may be defined by an inner side surface of the base layer 101 connecting the first surface S1 and the second surface S2. The terminal PT may at least partially overlap the inner side surface of the base layer 101. In an embodiment, the terminal PT may be spaced from (e.g., spaced apart from) a third surface S3 of the inner side surface of the base layer 101, the third surface S3 being connected to the second surface S2. That is, the third surface S3 of the inner side surface of the base layer 101 may be exposed. Accordingly, the second surface S2 and the lower surface PTLS of the terminal PT may form a step or level difference.

When manufacturing the display device 1, the base layer 101 and the opening portion OP may be formed on a support substrate having a relative rigidity. In addition, the terminal PT of the pad unit PAD may be formed in the opening portion OP. At this time, the terminal PT of the pad unit PAD may partially contact the support substrate, and when the support substrate and the base layer 101 are separated, the terminal PT of the pad unit PAD may not be separated from the support substrate. Accordingly, the reason that the lower surface PTLS of the terminal PT does not coincide with the second surface S2 may be to separate the terminal PT of the pad unit PAD from the support substrate. This will be described in more detail below.

The terminal PT may include a material having good conductivity. The terminal PT may include a conductive material including molybdenum (Mo), aluminum (Al), copper (Cu), titanium (Ti), and/or the like, and may include multiple layers or a single layer including the above-mentioned material. In an embodiment, the terminal PT may have a multilayer structure of Ti/Al/Ti.

The connection line CL may deliver, to a thin-film transistor TFT, control signals and/or power voltages delivered to the pad unit PAD. In an embodiment, the connection line CL may deliver at least one of a data signal, a scan signal, a first power supply voltage, or a second power supply voltage, which will be described in more detail below.

The connection line CL may be arranged above the first surface S1 of the base layer 101. In an embodiment, the connection line CL may be arranged on the first barrier layer 102. The connection line CL may be connected to the pad unit PAD. In an embodiment, the connection line CL may be connected to the terminal PT of the pad unit PAD. In an embodiment, the connection line CL may be integrally formed with the terminal PT. For example, the connection line CL and the terminal PT may form a monolithic structure.

The connection line CL may extend from the non-display area NDA to the display area DA. The connection line CL may be connected to the pad unit PAD in the pad area PADA of the non-display area NDA. In addition, the connection line CL may extend from the pad area PADA to the display area DA to deliver signals and power voltages to the thin-film transistor TFT arranged in the display area DA.

A plurality of connection lines CL may be provided. For example, the connection line CL may include a first connection line CL1 and a second connection line CL2. In an embodiment, the plurality of connection lines CL may be spaced from (e.g., spaced apart from) each other. For example, the first connection line CL1 and the second connection line CL2 may be spaced from (e.g., spaced apart from) each other.

The first connection line CL1 may be connected to the pad unit PAD. In one or more embodiments, the second connection line CL2 may be connected to another pad unit. That is, the plurality of connection lines CL may be connected (e.g., electrically connected) to a plurality of thin-film transistors TFT.

The connection line CL may include a material having good conductivity. The connection line CL may include Mo, Al, Cu, Ti, and/or the like, and may include multiple layers or a single layer including the above-mentioned material. In an embodiment, the connection line CL may have a multi-layer structure of Ti/Al/Ti.

The insulating layer 103 may be arranged on the terminal PT and the connection line CL. The insulating layer 103 may cover the terminal PT and the connection line CL.

In an embodiment, the insulating layer 103 may include a polymer resin such as polyethersulphone, polyarylate, polyetherimide, polyethylene naphthalate, polyethylene terephthalate, polyphenylene sulfide, polyimide, polycarbonate, cellulose triacetate, cellulose acetate propionate, and/or the like. In an embodiment, the insulating layer 103 may include the same material as the base layer 101. In an embodiment, the insulating layer 103 may include colored polyimide. In another embodiment, the insulating layer 103 may include transparent polyimide.

In another embodiment, the insulating layer 103 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide (ZnO), and/or the like.

In another embodiment, the insulating layer 103 may include an organic material. For example, the insulating layer 103 may include a general commercial polymer such as poly(methyl methacrylate) (PMMA) or polystyrene (PS), a polymer derivative having a phenol group, an acrylic polymer, an imide polymer, an aryl ether polymer, an amide polymer, a fluorine polymer, a p-xylene polymer, a vinyl alcohol polymer, and/or a mixture thereof.

The second barrier layer 104 may be arranged on the insulating layer 103. The second barrier layer 104 may prevent or reduce penetration of foreign substances. The second barrier layer 104 may include a single layer or multiple layers including an inorganic material such as silicon nitride ($SiN_x$), silicon oxynitride (SiON), and/or silicon oxide ($SiO_2$). In some embodiments, the second barrier layer 104 may be omitted.

The pixel circuit layer 200 may be arranged above the insulating layer 103. In an embodiment, the pixel circuit layer 200 may be arranged on the second barrier layer 104. The pixel circuit layer 200 may include at least one thin-film transistor TFT. In addition, the pixel circuit layer 200 may include an insulating layer arranged above and/or below a component of the thin-film transistor TFT. The plurality of thin-film transistors TFT may be included in the pixel circuit layer 200. The thin-film transistor TFT may include a semiconductor layer Act, a gate electrode GE, a source electrode SE, and a drain electrode DE.

The semiconductor layer Act may be arranged above the insulating layer 103. In an embodiment, the semiconductor layer Act may be arranged on the second barrier layer 104. The semiconductor layer Act may include polysilicon. Alternatively, the semiconductor layer Act may include an amorphous silicon, an oxide semiconductor, an organic semiconductor, and/or the like. The semiconductor layer Act may include a channel area, a drain area, and a source area, the drain area and the source area being arranged on respective sides of the channel area. The gate electrode GE may overlap (e.g., overlap in a plan view or overlap in the thickness direction of the base layer 101) the channel area.

The gate electrode GE may include a low-resistance metal material. The gate electrode GE may include a conductive material including Mo, Al, Cu, Ti, and/or the like, and may include multiple layers or a single layer including the above-mentioned material.

The source electrode SE and the drain electrode DE may be connected to the semiconductor layer Act. The source electrode SE and the drain electrode DE may be connected to the semiconductor layer Act through a contact hole included in the insulating layer of the pixel circuit layer 200, respectively. The source electrode SE and the drain electrode DE may include a material having good conductivity. The source electrode SE and the drain electrode DE may include a conductive material including Mo, Al, Cu, Ti, and/or the like, and may include multiple layers or a single layer including the above-mentioned material. In an embodiment, the source electrode SE and the drain electrode DE may have a multilayer structure of Ti/Al/Ti.

In an embodiment, at least one of the gate electrode GE, the source electrode SE, or the drain electrode DE may be connected to the connection line CL. The gate electrode GE, the source electrode SE, and the drain electrode DE may be connected to the connection line CL through a hole H respectively included in the insulating layer 103, the second barrier layer 104, and the insulating layer of the pixel circuit layer 200.

In an embodiment, the pixel circuit layer 200 may include the plurality of thin-film transistors TFT, and the plurality of thin-film transistors TFT may be respectively connected to the plurality of connection lines CL.

Referring to FIG. 2A, at least one of the source electrode SE or the drain electrode DE may be connected to the connection line CL. At least one of the source electrode SE or the drain electrode DE may be connected to the connection line CL through the hole H included in the insulating layer 103, the second barrier layer 104, and the insulating layer of the pixel circuit layer 200.

Referring to FIG. 2B, the gate electrode GE may be connected to the connection line CL. The gate electrode GE may be connected to the connection line CL through a hole H-1 included in the insulating layer 103, the second barrier layer 104, and the insulating layer of the pixel circuit layer 200. Hereinafter, a case of which at least one of the source electrode SE or the drain electrode DE is connected to the connection line CL will be described in more detail below, as shown in FIG. 2A.

The display element DPE may be arranged on the pixel circuit layer 200. A plurality of display elements DPE may be included on the pixel circuit layer 200. In an embodiment, the display element DPE may include a light-emitting diode. The light-emitting diode may include an organic light-emitting diode including an organic material as an emission layer. Alternatively, the light-emitting diode may include an inorganic light-emitting diode. Alternatively, the light-emitting diode may include a quantum dot as an emission layer. Alternatively, the light-emitting diode may be a micro-light-emitting diode. Alternatively, the light-emitting diode may be a nanorod light-emitting diode. In an embodiment, the nanorod light-emitting diode may include gallium nitride (GaN). In an embodiment, a color converting layer may be arranged above the nanorod light-emitting diode. The color converting layer may include quantum dots.

The display element DPE may be connected to the thin-film transistor TFT. In an embodiment, the display element DPE may be connected to one of the source electrode SE and the drain electrode DE. The plurality of display elements DPE may be respectively connected to the plurality of thin-film transistors TFT.

The protective layer 300 may be arranged on the display element DPE. The protective layer 300 may protect the display element DPE. The protective layer 300 may include at least one of an inorganic material or an organic material. In an embodiment, the protective layer 300 may be an encapsulation layer. For example, the encapsulation layer may include at least one organic encapsulation layer and at least one inorganic encapsulation layer. As another example, the encapsulation layer may have a structure in which an upper substrate is combined with a sealing member to seal an inner space between the base layer 101 and the upper substrate.

In an embodiment, a touch sensor layer may be included on the protective layer 300, the touch sensor layer being capable of sensing coordinate information according to a touch event. In an embodiment, an optical functional layer may be arranged on the protective layer 300. The optical functional layer may reduce reflectance of light (external light) incident from the outside toward the display device 1, and/or improve color purity of light emitted from the display device 1. In an embodiment, a cover window may be arranged on the protective layer 300. The cover window may include at least one of glass, sapphire, or plastic.

The printed circuit board 20 may be arranged to face the second surface S2 of the base layer 101. The printed circuit board 20 may include a driving circuit. The printed circuit board 20 may generate and output signals and voltages that control the display panel 10.

The flexible printed circuit film 30 may connect (e.g., electrically connect) the display panel 10 and the printed circuit board 20. One side of the flexible printed circuit film 30 may be connected (e.g., electrically connected) to the pad unit PAD of the display panel 10, and the other side of the flexible printed circuit film 30 may be connected (e.g., electrically connected) to the printed circuit board 20. In an embodiment, the flexible printed circuit film 30 may include an integrated circuit (IC).

As described above, the display panel 10 may be connected to the printed circuit board 20 through the pad unit PAD arranged in the opening portion OP of the base layer 101. Because the printed circuit board 20 is arranged to face the second surface S2 of the base layer 101, a user of the display device 1 may not view the printed circuit board 20. In addition, because the printed circuit board 20 is arranged to face the second surface S2 of the base layer 101, an area occupied by the non-display area NDA may be relatively reduced. Accordingly, an area occupied by the display area DA may be relatively increased.

The connection line CL may be arranged between the base layer 101 and the insulating layer 103. In addition, the connection line CL may extend, below the semiconductor layer Act, from the pad area PADA to the display area DA. The connection line CL may deliver a signal and a power voltage to the thin-film transistor TFT arranged in the display area DA by using a space between the base layer 101 and the insulating layer 103.

Figure 3A:
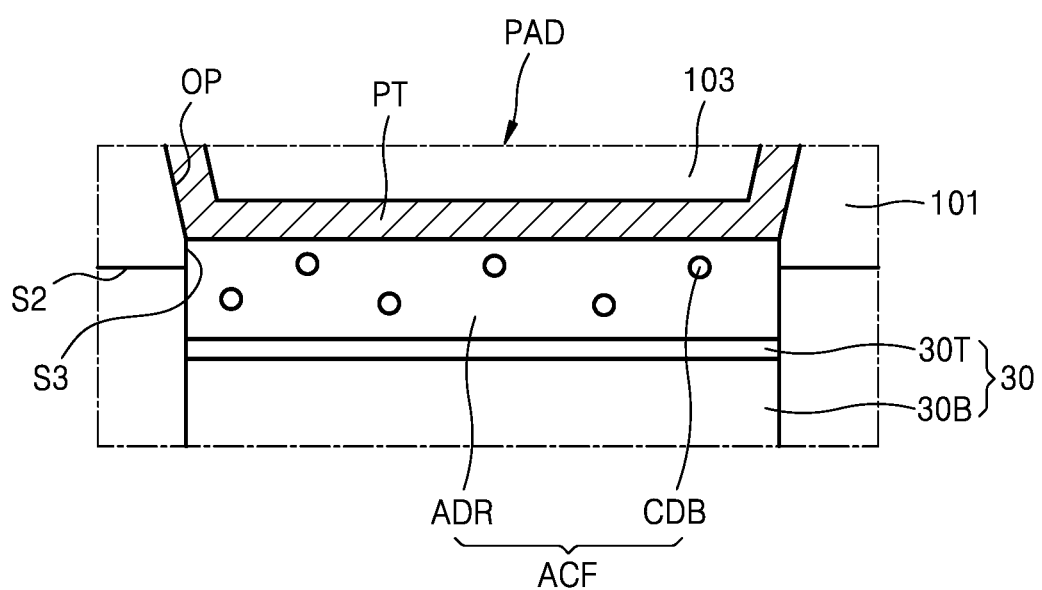
FIGS. 3A and 3B are schematic cross-sectional views of a portion of a pad unit and a portion of a flexible printed circuit film, according to various embodiments.
Figure 3B:
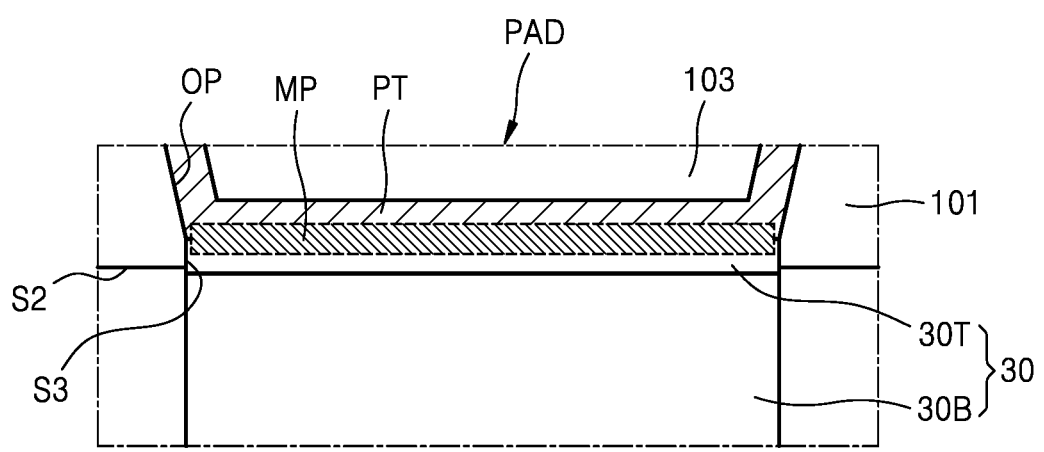

FIGS. 3A and 3B are schematic cross-sectional views of a portion of the pad unit PAD and a portion of the flexible printed circuit film 30, according to various embodiments. In FIGS. 3A and 3B, the same reference numerals as those in FIG. 2A refer to the same members, and redundant descriptions thereof may not be repeated.

Referring to FIG. 3A, the terminal PT of the pad unit PAD may be connected to the flexible printed circuit film 30. The flexible printed circuit film 30 may include a circuit terminal 30T and a flexible printed circuit film body portion 30B. The IC may be arranged in the flexible printed circuit film body portion 30B. In an embodiment, the terminal PT of the pad unit PAD may be connected (e.g., electrically connected) to the circuit terminal 30T of the flexible printed circuit film 30 through an anisotropic conductive film ACF. For example, the terminal PT of the pad unit PAD may be physically and/or electrically connected to the circuit terminal 30T of the flexible printed circuit film 30 through the anisotropic conductive film ACF, even though the terminal PT of the pad unit PAD may not be in direct contact with the circuit terminal 30T of the flexible printed circuit film 30.

The anisotropic conductive film ACF may include an adhesive resin ADR and a plurality of conductive balls CDB distributed in the adhesive resin ADR. The adhesive resin ADR may fix the plurality of conductive balls CDB in a certain area and physically connect the terminal PT of the pad unit PAD and the flexible printed circuit film 30. The plurality of conductive balls CDB may electrically connect the terminal PT of the pad unit PAD and the circuit terminal 30T of the flexible printed circuit film 30.

In another embodiment, the terminal PT of the pad unit PAD and the circuit terminal 30T of the flexible printed circuit film 30 may be connected (e.g., electrically connected) to each other by a plurality of soldering units.

Referring to FIG. 3B, the terminal PT of the pad unit PAD may be connected (e.g., directly connected) to the flexible printed circuit film 30. In an embodiment, the terminal PT of the pad unit PAD may be connected (e.g., electrically connected) to the circuit terminal 30T of the flexible printed circuit film 30. For example, the terminal PT of the pad unit PAD may be connected (e.g., electrically connected) to the circuit terminal 30T of the flexible printed circuit film 30 through a melting portion MP. The melting portion MP may be an alloy including a portion of the terminal PT of the pad unit PAD and a portion of the circuit terminal 30T of the flexible printed circuit film 30. The portion of the terminal PT of the pad unit PAD and the portion of the circuit terminal 30T of the flexible printed circuit film 30 may be melted and bonded in the melting portion MP.

Figure 4:
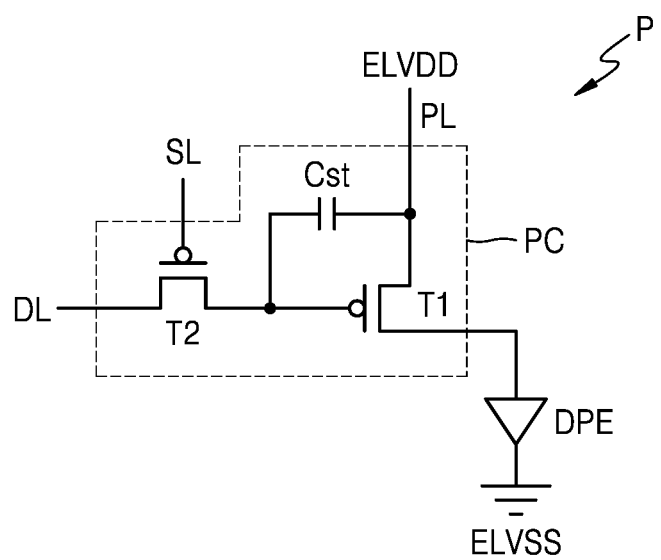
FIG. 4 is a schematic equivalent circuit diagram of a pixel according to an embodiment.

FIG. 4 is a schematic equivalent circuit diagram of the pixel P according to an embodiment.

Referring to FIG. 4, the pixel P may include a pixel circuit PC and the display element DPE.

The pixel circuit PC may include a driving thin-film transistor T1, a switching thin-film transistor T2, and a storage capacitor Cst. Each pixel P may emit, for example, red light, green light, or blue light or may emit red light, green light, blue light, or white light, through the display element DPE.

The switching thin-film transistor T2 may be connected to a scan line SL and a data line DL, and be configured to deliver, to the driving thin-film transistor T1, a data signal or a data voltage input from the data line DL based on a scan signal or a switching voltage input from the scan line SL. The storage capacitor Cst may be connected to the switching thin-film transistor T2 and a driving voltage line PL, and store a voltage corresponding to a difference between a voltage received from the switching thin-film transistor T2 and a first power supply voltage ELVDD supplied to the driving voltage line PL.

The driving thin-film transistor T1 may be connected to the driving voltage line PL and the storage capacitor Cst, and may control a driving current flowing from the driving voltage line PL to the display element DPE in accordance with a voltage value stored in the storage capacitor Cst. The display element DPE may emit light having a certain brightness according to the driving current.

Figure 5:
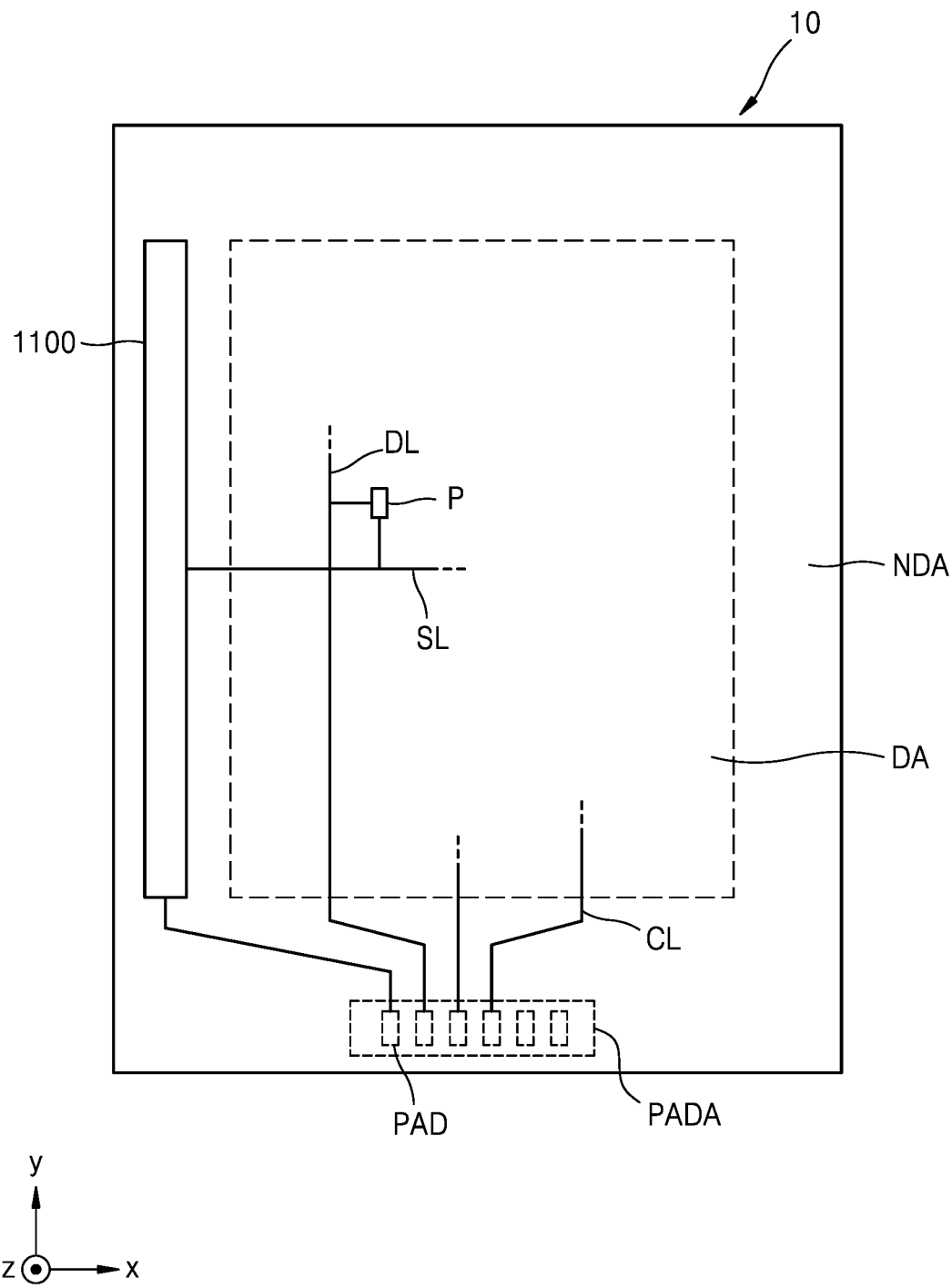
FIG. 5 is a schematic plan view of a display panel according to an embodiment.

FIG. 5 is a schematic plan view of the display panel 10 according to an embodiment.

Referring to FIG. 5, the display panel 10 may include the display area DA and the non-display area NDA. A plurality of pixels P including the pixel P may be arranged in the display area DA, and the plurality of pixels P may display an image. Each of the plurality of pixels P may be connected to the scan line SL extending in a first direction (e.g., an x-direction or an −x-direction) and the data line DL extending in a second direction (e.g., a y-direction or a −y-direction).

The non-display area NDA may at least partially surround the display area DA. In an embodiment, the non-display area NDA may entirely surround the display area DA.

A scan driver 1100 providing a scan signal to each pixel P may be arranged in the non-display area NDA. The scan driver 1100 may be connected (e.g., electrically connected) to the pad unit PAD through the connection line CL. In an embodiment, a data driver delivering a data signal to the pixel P may be arranged in the non-display area NDA.

The non-display area NDA may include the pad area PADA. The pad area PADA may be arranged outside the display area DA. In an embodiment, the pad unit PAD may be arranged in the pad area PADA. The pad unit PAD may be exposed through an opening portion penetrating a base layer, and may be connected (e.g., electrically connected) to a printed circuit board or an IC. A plurality of pad units PAD may be arranged in the pad area PADA.

In an embodiment, the connection line CL may extend from the pad area PADA to the display area DA. The pad unit PAD may be connected to the connection line CL. In an embodiment, the plurality of pad units PAD may be respectively connected to the plurality of connection lines CL. In an embodiment, the connection line CL may deliver, to the pixel P, at least one of a scan signal, a data signal, a first power supply voltage, or a second power supply voltage. In an embodiment, the connection line CL may be connected to the scan driver 1100.

Figure 6A:
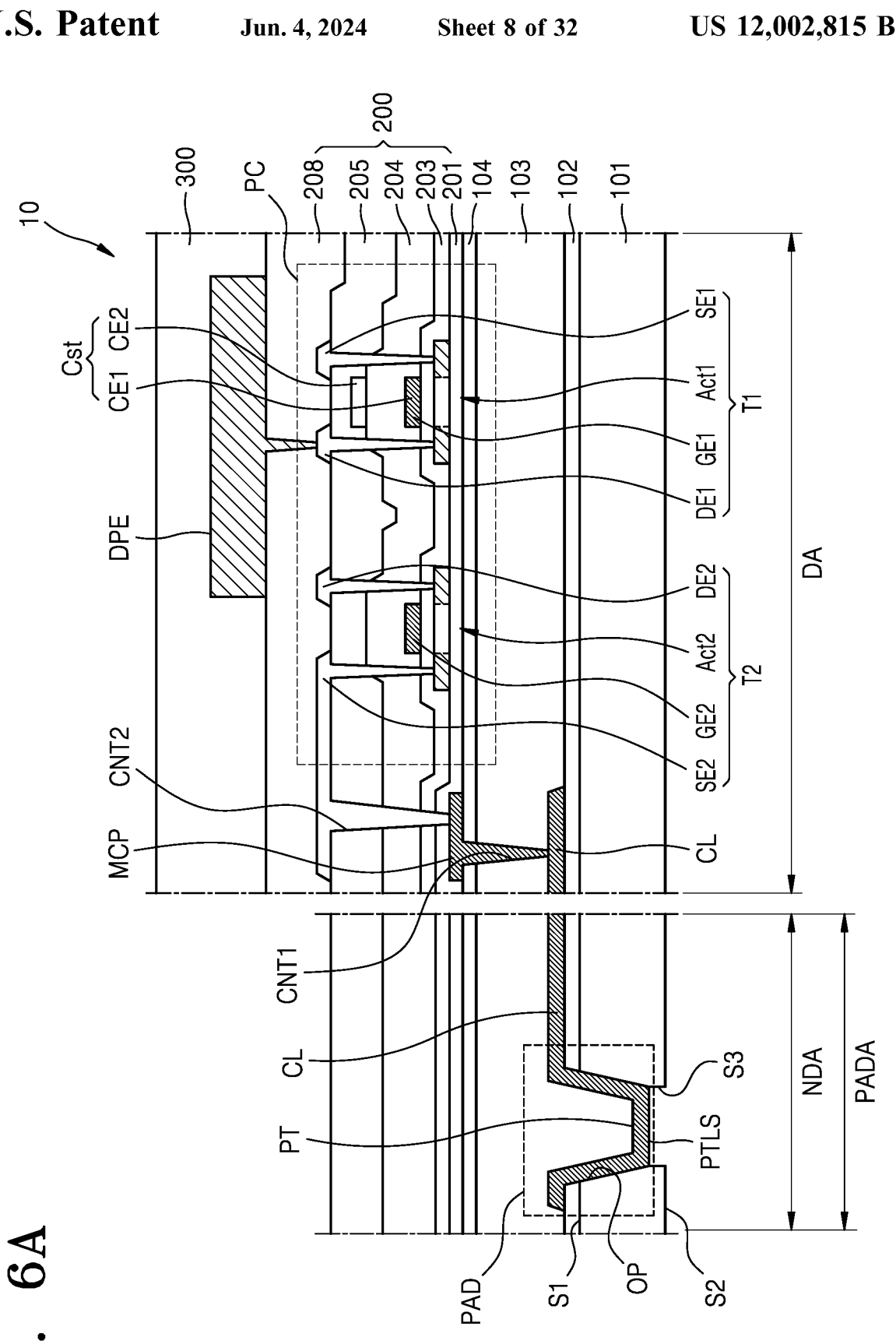
FIGS. 6A and 6B are schematic cross-sectional views of a display panel according to various embodiments.
Figure 6B:
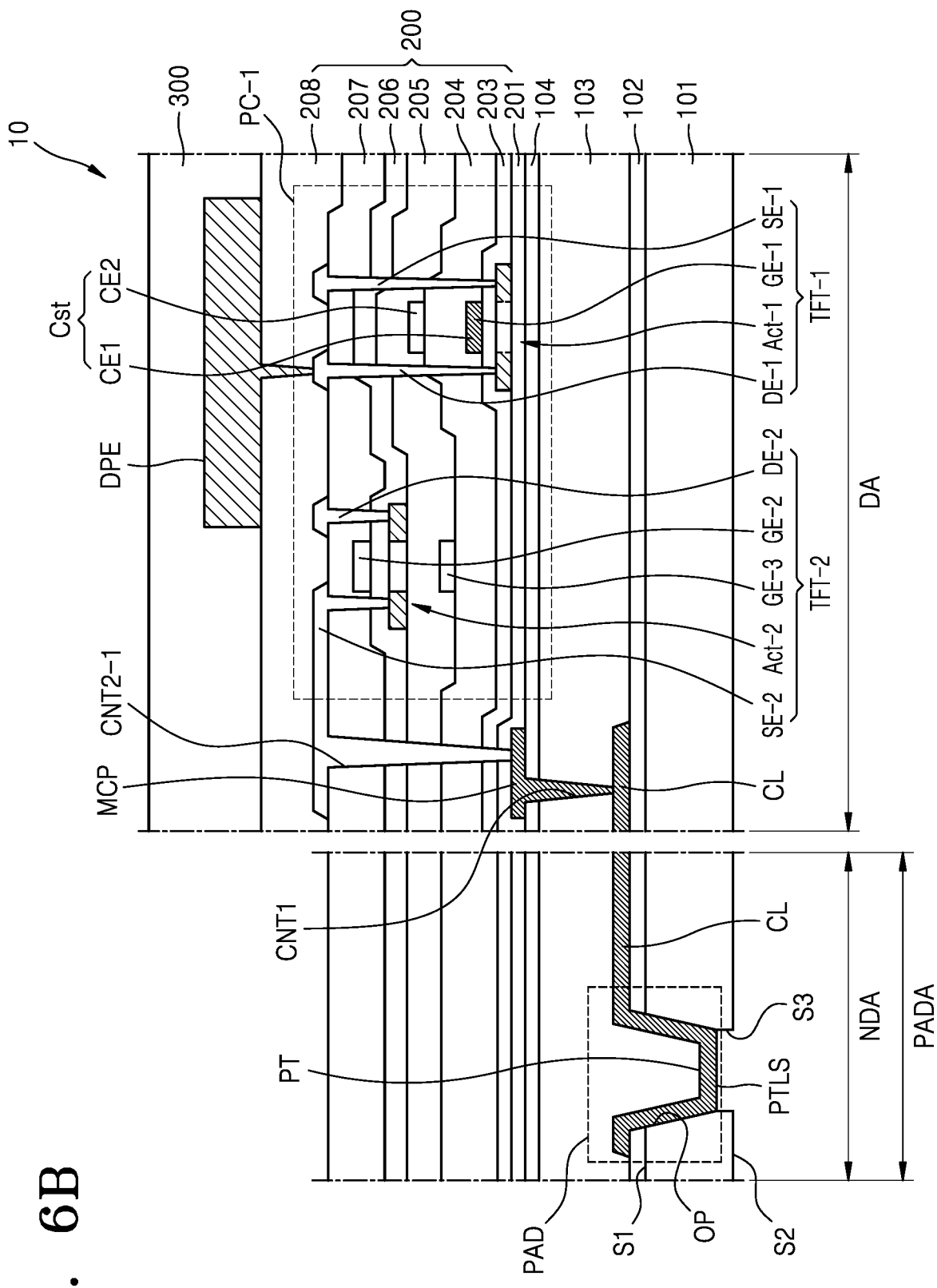

FIGS. 6A and 6B are schematic cross-sectional views of the display panel 10 according to various embodiments. In FIGS. 6A and 6B, the same reference numerals as those in FIG. 2A refer to the same members, and redundant descriptions thereof may not be repeated.

Referring to FIGS. 6A and 6B, the display panel 10 may include the base layer 101, the first barrier layer 102, the pad unit PAD, the connection line CL, the insulating layer 103, the second barrier layer 104, the pixel circuit layer 200, the display element DPE, and the protective layer 300.

The base layer 101 may include the first surface S1 and the second surface S2 opposite to the first surface S1, and have the opening portion OP penetrating the first surface S1 and the second surface S2 in the non-display area NDA. In an embodiment, the opening portion OP may overlap the pad area PADA included in the non-display area NDA.

The pad unit PAD may include the terminal PT arranged on the first surface S1 and extending through the opening portion OP.

The connection line CL may be connected to the terminal PT on the first surface S1, and may extend from the non-display area NDA to the display area DA.

Referring to FIG. 6A, the pixel circuit layer 200 may include a buffer layer 201, a first gate insulating layer 203, a second gate insulating layer 204, a first interlayer insulating layer 205, an organic insulating layer 208, a middle connection pattern MCP, and the pixel circuit PC. The pixel circuit PC may include the driving thin-film transistor T1, the switching thin-film transistor T2, and the storage capacitor Cst.

The buffer layer 201 may be arranged above the insulating layer 103. In an embodiment, the buffer layer 201 may be arranged on the second barrier layer 104. The buffer layer 201 may include an inorganic insulating material such as silicon nitride (SiN$_x$), silicon oxynitride (SiON), and/or silicon oxide (SiO$_2$), and may be a single layer or multiple layers including the above-stated inorganic insulating material.

The driving thin-film transistor T1 may include a driving semiconductor layer Act1, a driving gate electrode GE1, a driving drain electrode DE1, and a driving source electrode SE1.

The driving semiconductor layer Act1 may be arranged on the buffer layer 201. The driving semiconductor layer Act1 may include polysilicon. Alternatively, the driving semiconductor layer Act1 may include an amorphous silicon, an oxide semiconductor, an organic semiconductor, and/or the like. The driving semiconductor layer Act1 may include a channel area, a drain area, and a source area. The drain area and the source area may be arranged on respective sides of the channel area.

The driving gate electrode GE1 may be arranged above the driving semiconductor layer Act1. The driving gate electrode GE1 may overlap (e.g., overlap in a plan view or overlap in the thickness direction of the base layer 101) the channel area of the driving semiconductor layer Act1. The driving gate electrode GE1 may include a low-resistance metal material. For example, the driving gate electrode GE1 may include a conductive material such as Mo, Al, Cu, Ti, chromium (Cu), silver (Ag), nickel (Ni), tungsten (W), indium (In), zinc (Zn) and/or the like, and may include multiple layers or a single layer including the above-mentioned material.

The first gate insulating layer 203 between the driving semiconductor layer Act1 and the driving gate electrode GE1 may include an inorganic insulating material such as silicon oxide (SiO$_2$), silicon nitride (SiN$_x$), silicon oxynitride (SiON), aluminum oxide (Al$_2$O$_3$), titanium oxide (TiO$_2$), tantalum oxide (Ta$_2$O$_5$), hafnium oxide (HfO$_2$), zinc oxide (ZnO), and/or the like.

The second gate insulating layer 204 may be provided to cover the driving gate electrode GE1. Similar to the first gate insulating layer 203, the second gate insulating layer 204 may include an inorganic insulating material such as silicon oxide (SiO$_2$), silicon nitride (SiN$_x$), silicon oxynitride (SiON), aluminum oxide (Al$_2$O$_3$), titanium oxide (TiO$_2$), tantalum oxide (Ta$_2$O$_5$), hafnium oxide (HfO$_2$), zinc oxide (ZnO), and/or the like.

An upper electrode CE2 of the storage capacitor Cst may be arranged on the second gate insulating layer 204. The upper electrode CE2 may overlap (e.g., overlap in a plan view or overlap in the thickness direction of the base layer 101) the driving gate electrode GE1 which is below the upper electrode CE2. In one or more embodiments, the driving gate electrode GE1 and the upper electrode CE2 overlapping each other, with the second gate insulating layer 204 arranged therebetween, may form the storage capacitor Cst. That is, the driving gate electrode GE1 may function as a lower electrode CE1 of the storage capacitor Cst.

As such, the storage capacitor Cst and the driving thin-film transistor T1 may overlap each other. In some embodiments, the storage capacitor Cst may not overlap the driving thin-film transistor T1.

The upper electrode CE2 may include Al, platinum (Pt), palladium (Pd), Ag, magnesium (Mg), gold (Au), Ni, neodymium (Nd), iridium (Ir), Cr, calcium (Ca), Mo, Ti, W, and/or Cu, and may include a single layer or multiple layers including the above-mentioned material.

The first interlayer insulating layer 205 may cover the upper electrode CE2. The first interlayer insulating layer 205 may include silicon oxide (SiO$_2$), silicon nitride (SiN$_x$), silicon oxynitride (SiON), aluminum oxide (Al$_2$O$_3$), titanium oxide (TiO$_2$), tantalum oxide (Ta$_2$O$_5$), hafnium oxide (HfO$_2$), and/or zinc oxide (ZnO). The first interlayer insulating layer 205 may include a single layer or multiple layers including the above inorganic insulating material.

Each of the driving drain electrode DE1 and the driving source electrode SE1 may be located on the first interlayer insulating layer 205. The driving drain electrode DE1 and the driving source electrode SE1 may be connected to the driving semiconductor layer Act1 through a contact hole included in the first gate insulating layer 203, the second gate insulating layer 204, and the first interlayer insulating layer 205, respectively. The driving drain electrode DE1 and the driving source electrode SE1 may include a material having good conductivity. The driving drain electrode DE1 and the driving source electrode SE1 may include a conductive material including Mo, Al, Cu, Ti, and/or the like, and may include multiple layers or a single layer including the above-mentioned material. In an embodiment, the driving drain electrode DE1 and the driving source electrode SE1 may have a multilayer structure of Ti/Al/Ti.

The switching thin-film transistor T2 may include a switching semiconductor layer Act2, a switching gate electrode GE2, a switching drain electrode DE2, and a switching source electrode SE2. Because the switching semiconductor layer Act2, the switching gate electrode GE2, the switching drain electrode DE2, and the switching source electrode SE2 are respectively similar to the driving semiconductor layer Act1, the driving gate electrode GE1, the driving drain electrode DE1, and the driving source electrode SE1, detailed descriptions thereof may not be repeated.

The organic insulating layer 208 may be arranged to cover the driving drain electrode DE1 and the driving source electrode SE1. The organic insulating layer 208 may include a general commercial polymer such as PMMA or PS, a polymer derivative having a phenol group, an acrylic polymer, an imide polymer, an aryl ether polymer, an amide polymer, a fluorine polymer, a p-xylene polymer, a vinyl alcohol polymer, and/or a mixture thereof.

The middle connection pattern MCP may be arranged on the insulating layer 103. In one or more embodiments, the middle connection pattern MCP may be arranged on the second barrier layer 104. In an embodiment, the middle connection pattern MCP may be arranged between the insulating layer 103 and the buffer layer 201. In one or more embodiments, the middle connection pattern MCP may be arranged between the second barrier layer 104 and the buffer layer 201. In another embodiment, the middle connection pattern MCP may be arranged between one of insulating layers of the pixel circuit layer 200 and another one of the insulating layers of the pixel circuit layer 200. For example, the middle connection pattern MCP may be arranged between the buffer layer 201 and the first gate insulating layer 203. As another example, the middle connection pattern MCP may be arranged between the first gate insulating layer 203 and the second gate insulating layer 204.

The middle connection pattern MCP may be connected to the connection line CL through a first contact hole CNT1 of the insulating layer 103. In one or more embodiments, the middle connection pattern MCP may be connected to the connection line CL through a first contact hole CNT1 of the insulating layer 103 and the second barrier layer 104. In an embodiment, the middle connection pattern MCP may be arranged in the display area DA. In this case, the middle connection pattern MCP may be connected to the connection line CL through the first contact hole CNT1 overlapping the display area DA.

The pixel circuit PC may be connected to the middle connection pattern MCP. In an embodiment, one of the driving thin-film transistor T1 and the switching thin-film transistor T2 may be connected to the middle connection pattern MCP. For example, the middle connection pattern MCP may be connected to one of the switching source electrode SE2 and the switching drain electrode DE2. The middle connection pattern MCP may be connected to one of the switching source electrode SE2 and the switching drain electrode DE2 through a second contact hole CNT2 included in the first gate insulating layer 203, the second gate insulating layer 204, and the first interlayer insulating layer 205.

The pixel circuit PC may be connected (e.g., electrically connected) to the connection line CL. Accordingly, the connection line CL may deliver, to the pixel circuit PC, signals and/or voltages delivered to the pad unit PAD.

Referring to FIG. 6B, the pixel circuit layer 200 may include the buffer layer 201, the first gate insulating layer 203, the second gate insulating layer 204, the first interlayer insulating layer 205, a third gate insulating layer 206, a second interlayer insulating layer 207, the organic insulating layer 208, the middle connection pattern MCP, and a pixel circuit PC-1. The pixel circuit PC-1 may include a first thin-film transistor TFT-1, a second thin-film transistor TFT-2, and the storage capacitor Cst.

The third gate insulating layer 206 may be arranged on the first interlayer insulating layer 205. Similar to the first gate insulating layer 203, the third gate insulating layer 206 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide (ZnO), and/or the like.

The second interlayer insulating layer 207 may be arranged between the third gate insulating layer 206 and the organic insulating layer 208. Similar to the first interlayer insulating layer 205, the second interlayer insulating layer 207 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide (ZnO), and/or the like.

The first thin-film transistor TFT-1 may include a first semiconductor layer Act-1, a first gate electrode GE-1, a first drain electrode DE-1, and a first source electrode SE-1. The first thin-film transistor TFT-1 may be substantially similar to the driving thin-film transistor T1 or the switching thin-film transistor T2 described in more detail with reference to FIG. 6A. Herein, the first semiconductor layer Act-1 of the first thin-film transistor TFT-1 may include polysilicon. The first drain electrode DE-1 and the first source electrode SE-1 may be arranged between the second interlayer insulating layer 207 and the organic insulating layer 208.

The second thin-film transistor TFT-2 may include a second semiconductor layer Act-2, a second gate electrode GE-2, a third gate electrode GE-3, a second drain electrode DE-2, and a second source electrode SE-2. In some embodiments, any one of the second gate electrode GE-2 and the third gate electrode GE-3 may be omitted.

The second semiconductor layer Act-2 may be arranged between the first interlayer insulating layer 205 and the third gate insulating layer 206. That is, the second semiconductor layer Act-2 may be arranged on a layer different from the first semiconductor layer Act-1. In one or more embodiments, the second semiconductor layer Act-2 may be arranged at a different layer from the first semiconductor layer Act-1. The second semiconductor layer Act-2 may include a channel area, a source area, and a drain area, the source area and the drain area being arranged on respective sides of the channel area. In some embodiments, the second semiconductor layer Act-2 may include an oxide semiconductor. For example, the second semiconductor layer Act-2 may include a zinc-oxide-based material, and may include Zn oxide, In—Zn oxide, Ga—In—Zn oxide, and/or the like. Alternatively, the second semiconductor layer Act-2 may include an In—Ga—Zn—O (IGZO), In—Sn—Zn—O (ITZO), or In—Ga—Sn—Zn—O (IGTZO) semiconductor, which include a metal such as In, Ga, and tin (Sn) in ZnO.

The source area and the drain area of the second semiconductor layer Act-2 may be formed by adjusting a carrier concentration of an oxide semiconductor to make the source area and the drain area conductive. For example, the source area and the drain area of the second semiconductor layer Act-2 may be formed by increasing the carrier concentration through a plasma treatment using a hydrogen-based gas, a fluorine-based gas, or a combination thereof on the oxide semiconductor.

The second gate electrode GE-2 may overlap (e.g., overlap in a plan view or overlap in the thickness direction of the base layer 101) the channel area of the second semiconductor layer Act-2. The second gate electrode GE-2 may be arranged between the third gate insulating layer 206 and the second interlayer insulating layer 207. That is, the second gate electrode GE-2 may be insulated from the second semiconductor layer Act-2 by the third gate insulating layer 206. Although the third gate insulating layer 206 is illustrated as being entirely arranged above the base layer 101 in FIG. 6B, in another embodiment, the third gate insulating layer 206 may be provided by being patterned according to the shape of the second gate electrode GE-2.

The second gate electrode GE-2 may include a conductive material including Mo, Al, Cu, Ti, and/or the like, and may include multiple layers or a single layer including the above-mentioned material.

The third gate electrode GE-3 may be arranged below the second semiconductor layer Act-2 to overlap (e.g., overlap in a plan view or overlap in the thickness direction of the base layer 101) the channel area of the second semiconductor layer Act-2. The third gate electrode GE-3 may be arranged between the second gate insulating layer 204 and the first interlayer insulating layer 205. The third gate electrode GE-3 may be arranged on the same layer as the upper electrode CE2 of the storage capacitor Cst. In one or more embodiments, the third gate electrode GE-3 may be arranged at the same layer as the upper electrode CE2 of the storage capacitor Cst.

The second source electrode SE-2 and the second drain electrode DE-2 may be arranged between the second interlayer insulating layer 207 and the organic insulating layer 208, and may be connected to the second semiconductor layer Act-2. The second source electrode SE-2 and the second drain electrode DE-2 may be connected to the second semiconductor layer Act-2 through a contact hole included in the third gate insulating layer 206 and the second interlayer insulating layer 207.

The pixel circuit PC-1 may be connected to the middle connection pattern MCP. In an embodiment, one of the first thin-film transistor TFT-1 and the second thin-film transistor TFT-2 may be connected to the middle connection pattern MCP. For example, the middle connection pattern MCP may be connected to one of the second source electrode SE-2 and the second drain electrode DE-2. The middle connection pattern MCP may be connected to one of the second source electrode SE-2 and the second drain electrode DE-2 through a second contact hole CNT2-1 included in the first gate insulating layer 203, the second gate insulating layer 204, the first interlayer insulating layer 205, the third gate insulating layer 206, and the second interlayer insulating layer 207.

The first thin-film transistor TFT-1 including the first semiconductor layer Act-1 including polysilicon has high reliability, which may be used as a driving thin-film transistor to form a high-quality display panel.

Because an oxide semiconductor has high carrier mobility and low leakage current, a voltage drop may not be large even when a driving time is long. That is, because color change of an image according to a voltage drop is not large even during low-frequency driving, the low-frequency driving is possible. In this way, because the oxide semiconductor has an advantage of having a small leakage current, leakage current may be prevented and power consumption may be reduced at the same time by using an oxide semiconductor in at least one of other thin-film transistors other than the driving thin-film transistor.

Figure 7:
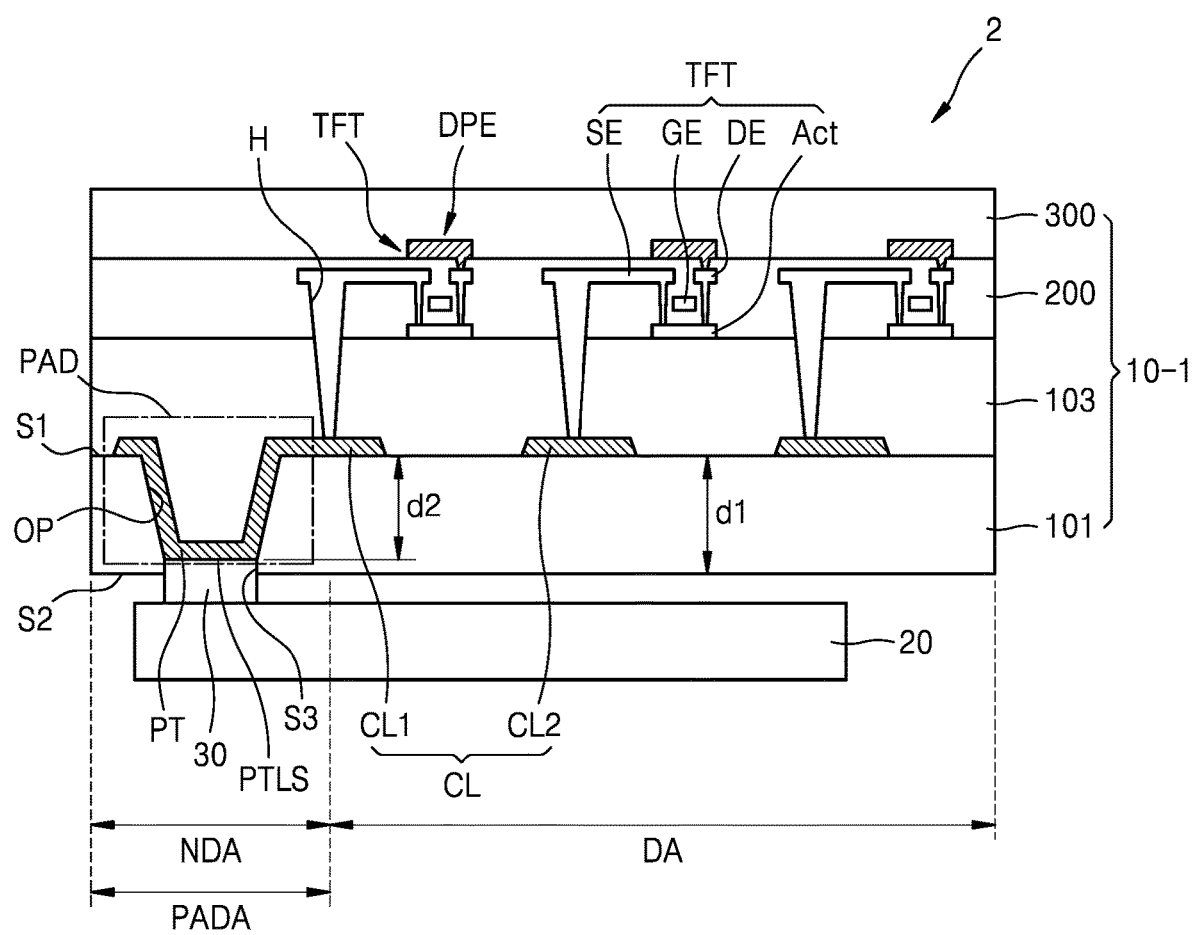
FIG. 7 is a schematic cross-sectional view of a display device according to an embodiment.

FIG. 7 is a schematic cross-sectional view of a display device 2 according to an embodiment. In FIG. 7, the same reference numerals as those in FIG. 2A refer to the same members, and redundant descriptions thereof may not be repeated. The embodiment described with reference to FIG. 7 is different from the embodiment described with reference to FIG. 2A in that a first barrier layer and a second barrier layer are omitted.

Referring to FIG. 7, the display device 2 may include a display panel 10-1, the printed circuit board 20, and the flexible printed circuit film 30. The display panel 10-1 may display an image. The display panel 10-1 may include the base layer 101, the pad unit PAD, the connection line CL, the insulating layer 103, the pixel circuit layer 200, the display element DPE, and the protective layer 300.

The base layer 101 may be arranged in the display area DA and the non-display area NDA. The base layer 101 may include the first surface S1 and the second surface S2 opposite to the first surface S1. The base layer 101 may have the opening portion OP penetrating the first surface S1 and the second surface S2.

The pad unit PAD may include the terminal PT, and the terminal PT may be connected (e.g., electrically connected) to the flexible printed circuit film 30. The terminal PT may be arranged on the first surface S1. The terminal PT may extend through the opening portion OP.

The connection line CL may be arranged on the first surface S1. The connection line CL may be connected to the pad unit PAD. In an embodiment, the connection line CL may be connected to the terminal PT of the pad unit PAD.

The insulating layer 103 may be arranged on the terminal PT and the connection line CL. The insulating layer 103 may cover the terminal PT and the connection line CL.

Figure 17A:
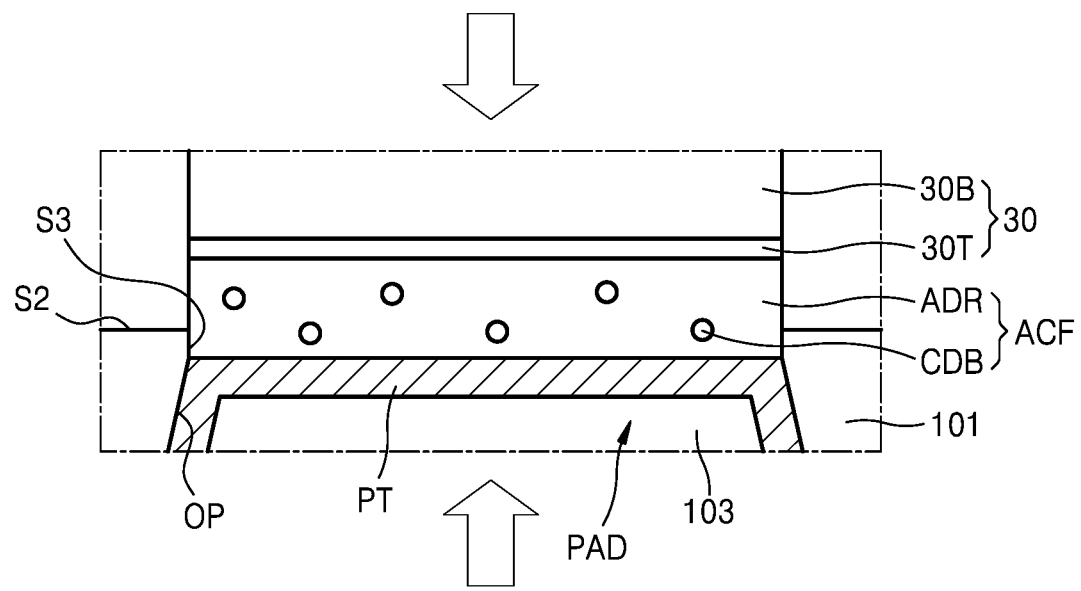
FIGS. 17A and 17B are schematic cross-sectional views illustrating a method of connecting a terminal and a flexible printed circuit film according to various embodiments.
Figure 17B:
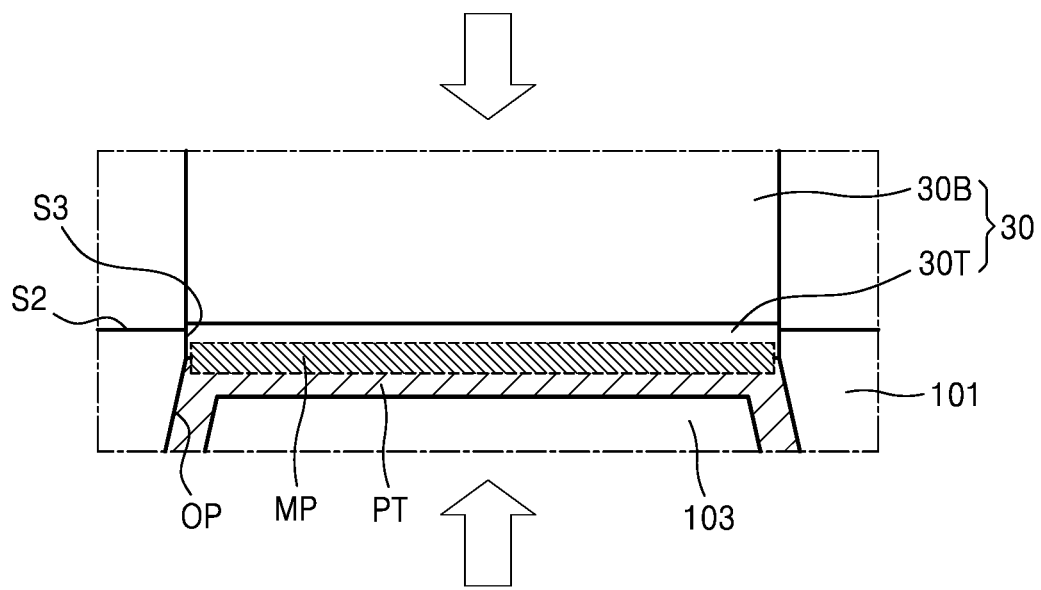
Figure 18:
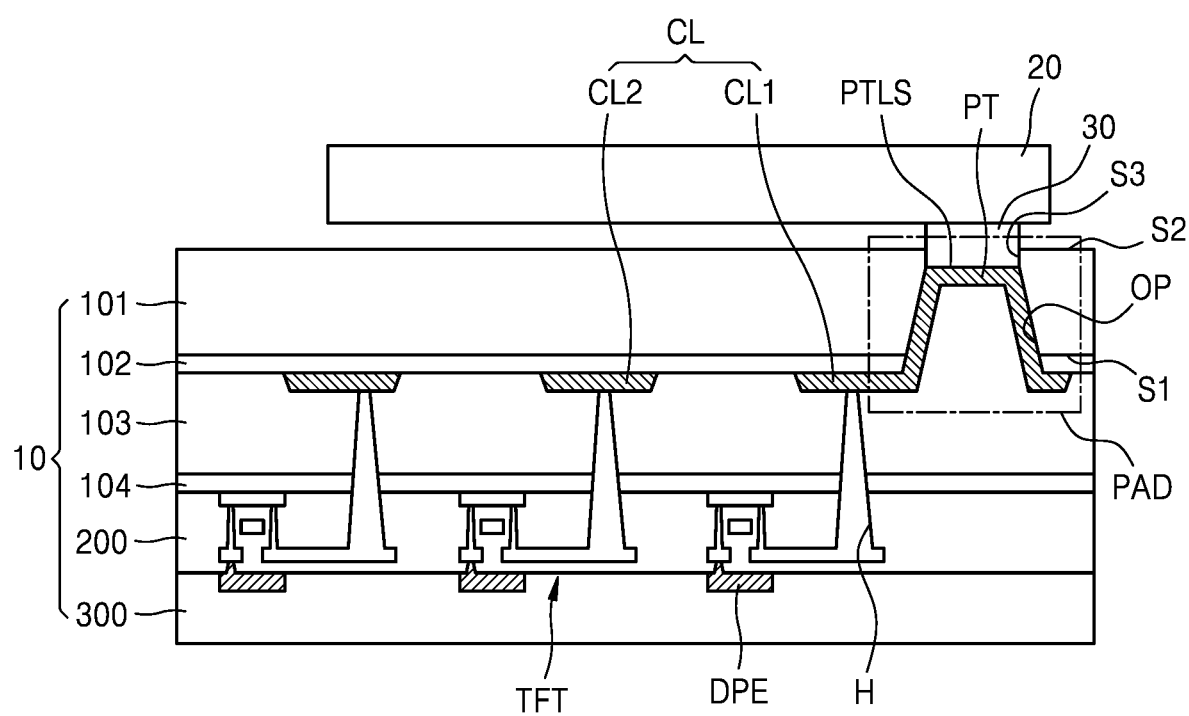
FIG. 18 is a schematic cross-sectional view illustrating a method of manufacturing a display device according to an embodiment.

FIGS. 8-16 are schematic cross-sectional views illustrating a method of manufacturing a display device according to an embodiment. FIGS. 17A and 17B are schematic cross-sectional views illustrating a method of connecting the terminal PT and the flexible printed circuit film 30, according to various embodiments. FIG. 18 is a schematic cross-sectional view illustrating a method of manufacturing a display device according to an embodiment.

Figure 8:
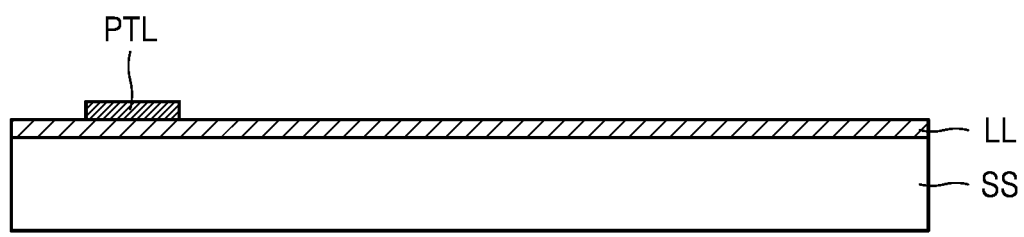
FIGS. 8-16 are schematic cross-sectional views illustrating a method of manufacturing a display device according to an embodiment.

Referring to FIG. 8, a lower layer LL and a pattern layer PTL may be formed on a support substrate SS. The support substrate SS may be a material having hardness and rigidity that may be sufficient to support a display device which is being manufactured, and may include, for example, glass.

The lower layer LL may include a material that is, in an operation of separating a base layer and/or a terminal from the support substrate SS to be described in more detail below, easy to detach (e.g., detach the base layer and/or the terminal from the support substrate SS). An adhesive strength between the lower layer LL and the support substrate SS may be greater than an adhesive strength between the lower layer LL and the base layer and/or the terminal. The lower layer LL may include at least one of amorphous silicon (a-Si), polysilicon (Poly-Si), crystalline silicon (Crystalline-Si), ZnO, or IZO. In an embodiment, when using an excimer laser having a wavelength of 308 nm, the lower layer LL may or should include a-Si. However, the present disclosure is not limited thereto, and the lower layer LL may include any material capable of easily detaching the base layer and/or the terminal from the support substrate SS to be described in more detail below.

The pattern layer PTL may be arranged on the lower layer LL. The pattern layer PTL may be formed on at least a portion of the lower layer LL. The pattern layer PTL may include a material that is, in an operation of separating the terminal from the support substrate SS to be described in more detail below, easy to detach (e.g., detach the terminal from the support substrate SS). An adhesive strength between the pattern layer PTL and the lower layer LL may be greater than an adhesive strength between the pattern layer PTL and the terminal to be described in more detail below. In an embodiment, the pattern layer PTL may include the same material as the lower layer LL. For example, the pattern layer PTL may include at least one of a-Si, Poly-Si, Crystalline-Si, ZnO, or IZO. In an embodiment, the pattern layer PTL may include a conductive material. For example, the pattern layer PTL may include a metal having conductivity, a non-metal having conductivity, and/or the like. In an embodiment, the pattern layer PTL may include at least one of an organic insulating material or an inorganic insulating material.

Figure 9:
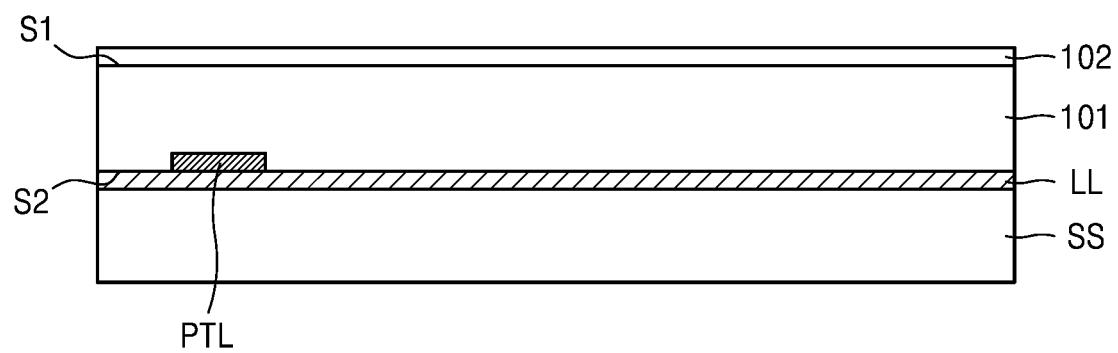

Referring to FIG. 9, the base layer 101 may be formed on the lower layer LL and the pattern layer PTL. The base layer 101 may cover the lower layer LL and the pattern layer PTL. The base layer 101 may include the first surface S1 and the second surface S2 opposite to the first surface S1. The second surface S2 may face the lower layer LL and the pattern layer PTL. In an embodiment, the first barrier layer 102 may be formed on the base layer 101. The first barrier layer 102 may face the first surface S1 of the base layer 101. In some embodiments, an operation of forming the first barrier layer 102 may be omitted.

Figure 10:
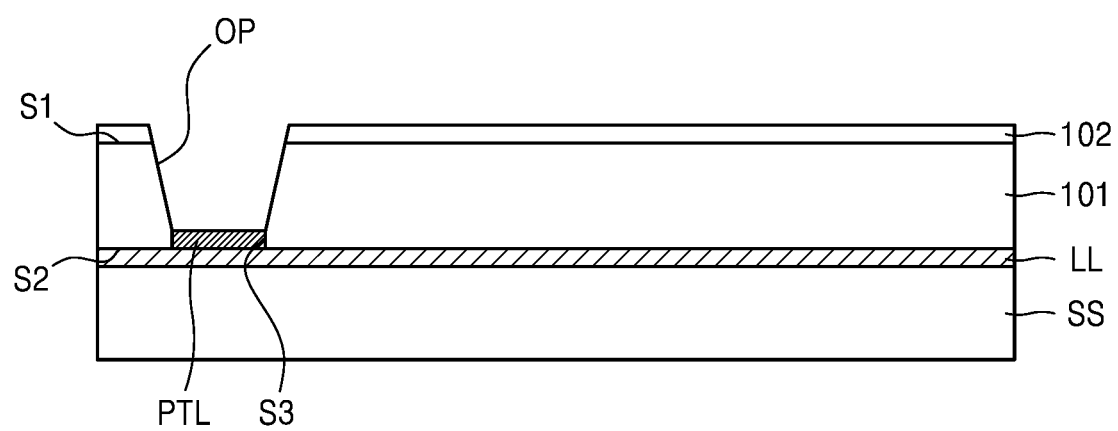

Referring to FIG. 10, the opening portion OP is formed in the base layer 101. The opening portion OP may penetrate the first surface S1 and the second surface S2. In an embodiment, the base layer 101 may be etched to form the opening portion OP. For example, the base layer 101 may be dry-etched to form the opening portion OP.

The opening portion OP may overlap the pattern layer PTL. The opening portion OP may expose the pattern layer PTL. When the first barrier layer 102 is arranged on the base layer 101, an opening portion exposing the pattern layer PTL may also be formed in the first barrier layer 102.

The opening portion OP may be defined by an inner side surface of the base layer 101 connecting the first surface S1 and the second surface S2. The third surface S3 of the inner side surface of the base layer 101 may overlap the pattern layer PTL, the third surface S3 being connected to the second surface S2.

Figure 11:
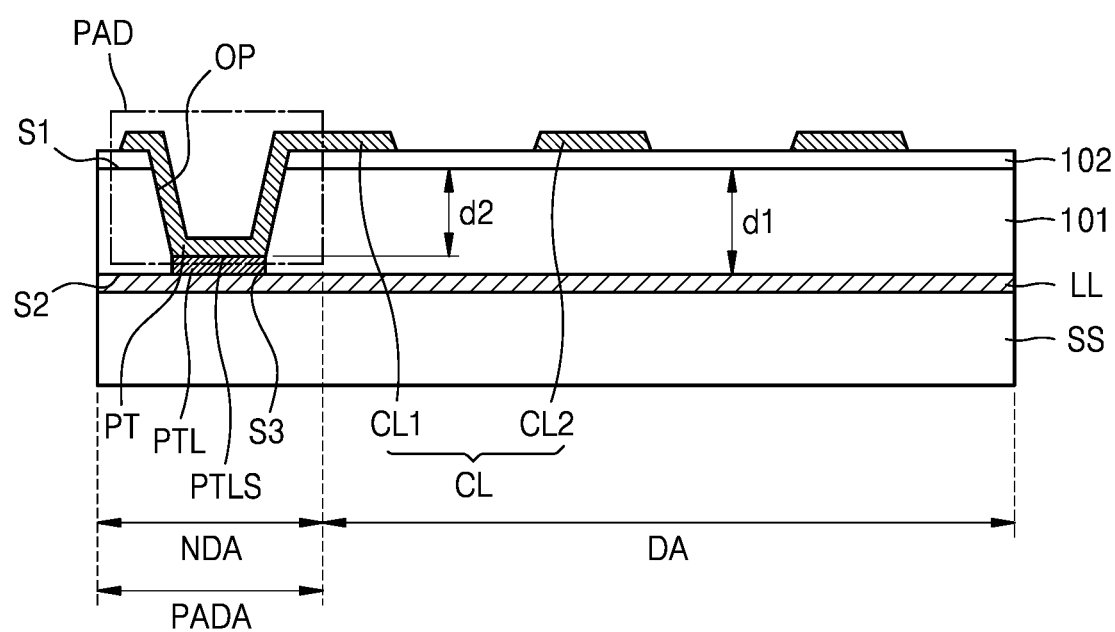

Referring to FIG. 11, the pad unit PAD including the terminal PT may be formed. The terminal PT may be formed on the first surface S1. In an embodiment, the terminal PT may be formed on the first barrier layer 102. The terminal PT may overlap the opening portion OP. The terminal PT may extend in a direction from the first surface S1 to the second surface S2 through the opening portion OP.

The terminal PT may cover the pattern layer PTL. The lower surface PTLS of the terminal PT may not coincide with the second surface S2. In an embodiment, the lower surface PTLS of the terminal PT overlapping the opening portion OP may be arranged between the first surface S1 and the second surface S2. In an embodiment, the first distance d1 from the first surface S1 to the second surface S2 may be greater than the second distance d2 from the first surface S1 to the lower surface PTLS of the terminal PT. Herein, the first distance d1 may be a thickness of the base layer 101. Therefore, the first distance d1 and the second distance d2 may be measured in the thickness direction of the base layer 101 as shown in FIG. 11.

The terminal PT may be spaced from (e.g., spaced apart from) the third surface S3. Accordingly, the second surface S2 and the lower surface PTLS of the terminal PT may form a step or level difference.

The connection line CL may be formed above the base layer 101. In an embodiment, the connection line CL may be formed on the first barrier layer 102. The connection line CL may be connected to the pad unit PAD. In an embodiment, the connection line CL may be connected to the terminal PT of the pad unit PAD. In an embodiment, the connection line CL may be integrally formed with the terminal PT. In an embodiment, the connection line CL may be concurrently (e.g., simultaneously) formed with the terminal PT of the pad unit PAD.

The connection line CL may extend from the non-display area NDA to the display area DA. The connection line CL may be connected to the pad unit PAD in the pad area PADA of the non-display area NDA.

The plurality of connection lines CL may be provided. For example, the connection line CL may include the first connection line CL1 and the second connection line CL2. In an embodiment, the plurality of connection lines CL may be spaced from (e.g., spaced apart from) each other. For example, the first connection line CL1 and the second connection line CL2 may be spaced from (e.g., spaced apart from) each other. The first connection line CL1 may be connected to the pad unit PAD. In one or more embodiments, the second connection line CL2 may also be connected to another pad unit.

Figure 12:
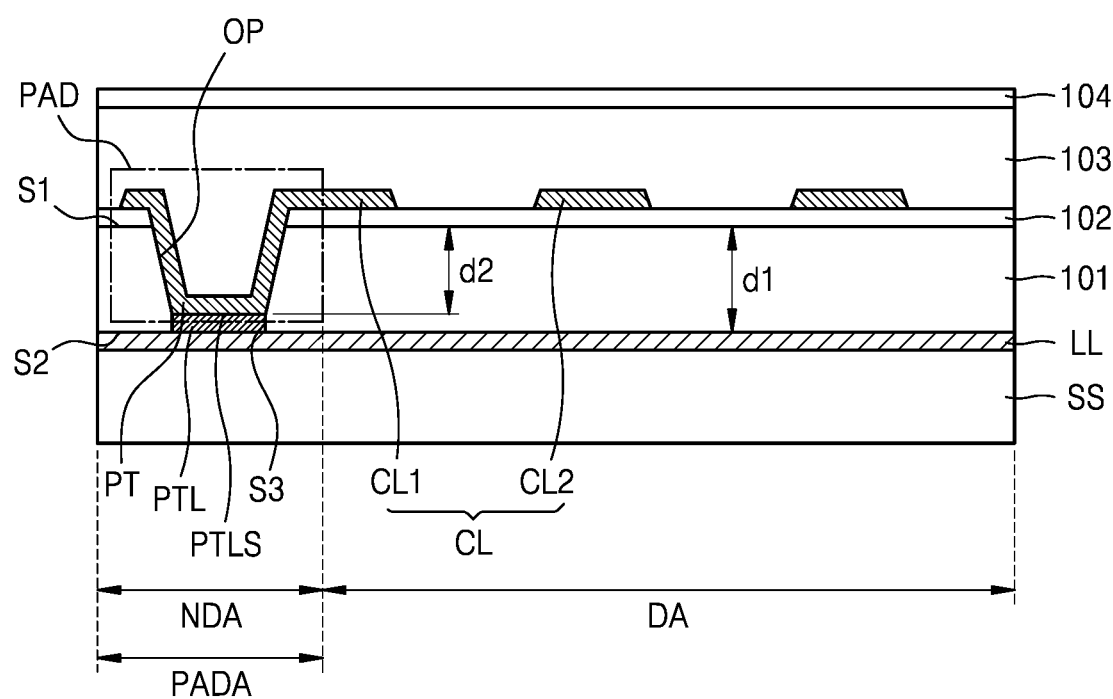

Referring to FIG. 12, the insulating layer 103 may be formed. The insulating layer 103 may cover the terminal PT and the connection line CL. In an embodiment, the insulating layer 103 may include a polymer resin. In an embodiment, the insulating layer 103 may include an inorganic insulating material. In an embodiment, the insulating layer 103 may include an organic insulating material.

In an embodiment, the second barrier layer 104 may be formed on the insulating layer 103. In some embodiments, an operation of forming the second barrier layer 104 may be omitted.

Figure 13:
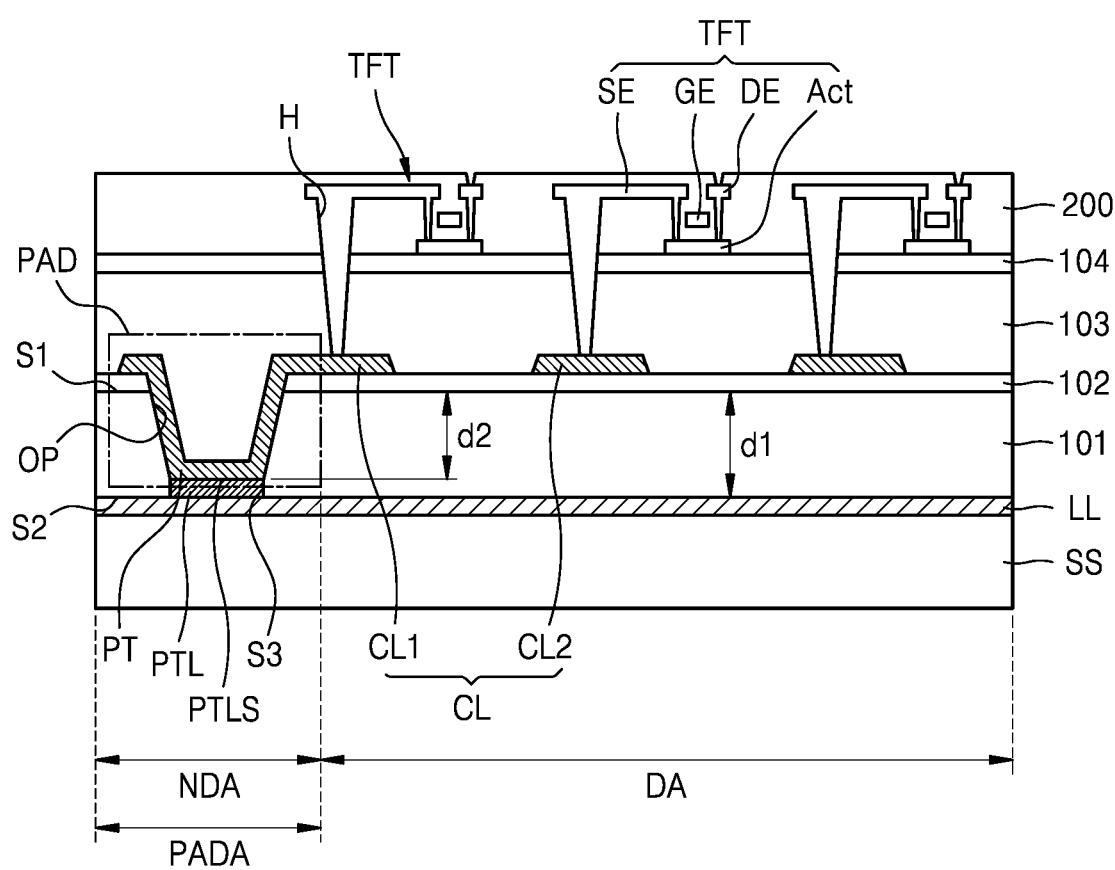

Referring to FIG. 13, the pixel circuit layer 200 may be formed above the insulating layer 103. The pixel circuit layer 200 may include at least one thin-film transistor TFT. The pixel circuit layer 200 may include an insulating layer arranged above and/or below a component of the thin-film transistor TFT. The thin-film transistor TFT may include the semiconductor layer Act, the gate electrode GE, the source electrode SE, and the drain electrode DE.

The semiconductor layer Act may be formed above the insulating layer 103. In an embodiment, the semiconductor layer Act may be formed on the second barrier layer 104.

In an embodiment, the pixel circuit layer 200 may include the plurality of thin-film transistors TFT, and the plurality of thin-film transistors TFT may be respectively connected to the plurality of connection lines CL. At least one of the source electrode SE or the drain electrode DE may be connected to the connection line CL. At least one of the source electrode SE or the drain electrode DE may be connected to the connection line CL through the hole H included in the insulating layer 103, the second barrier layer 104, and the insulating layer of the pixel circuit layer 200. In another embodiment, the gate electrode GE may be connected to the connection line CL through a hole included in the insulating layer 103, the second barrier layer 104, and the insulating layer of the pixel circuit layer 200.

Figure 14:
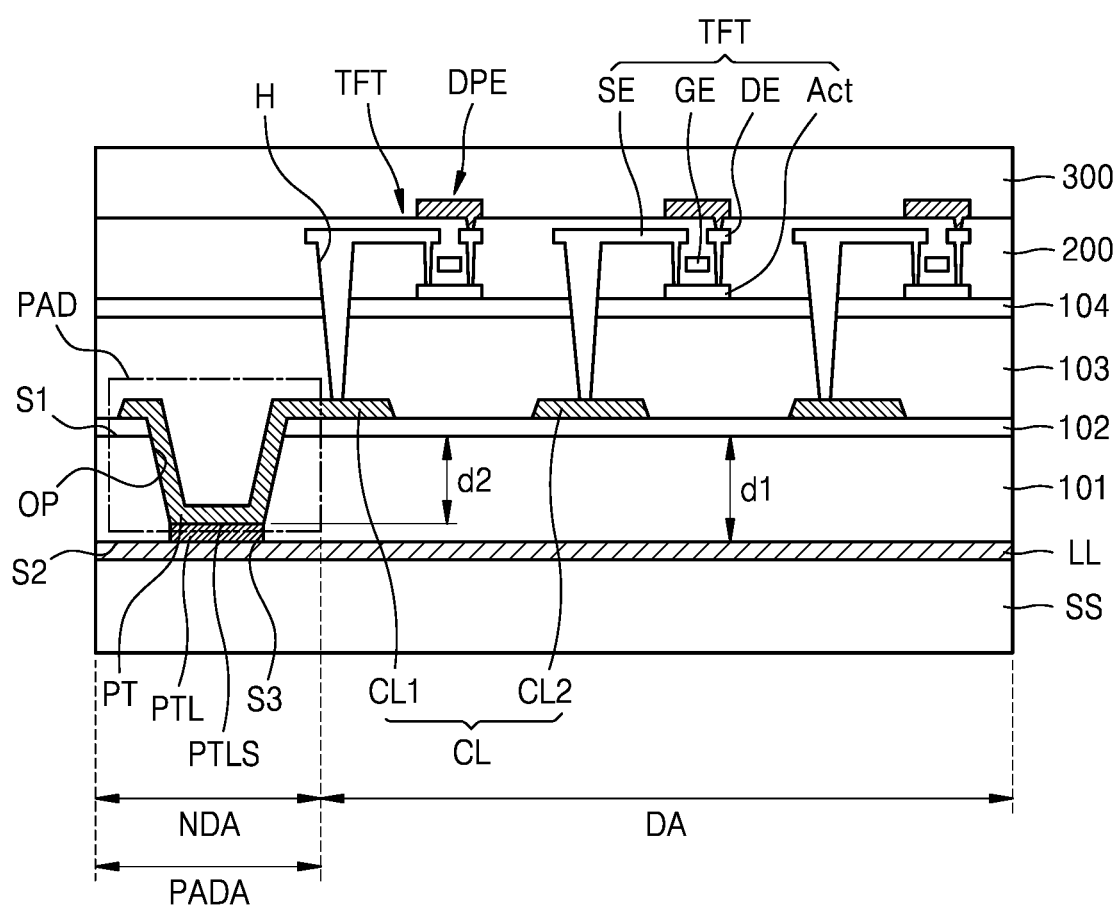

Referring to FIG. 14, the display element DPE may be formed on the pixel circuit layer 200. The plurality of display elements DPE may be formed on the pixel circuit layer 200. The display element DPE may be connected to the thin-film transistor TFT. In an embodiment, the display element DPE may be connected to one of the source electrode SE and the drain electrode DE.

The protective layer 300 may be formed on the display element DPE. The protective layer 300 may protect the display element DPE.

Figure 15:
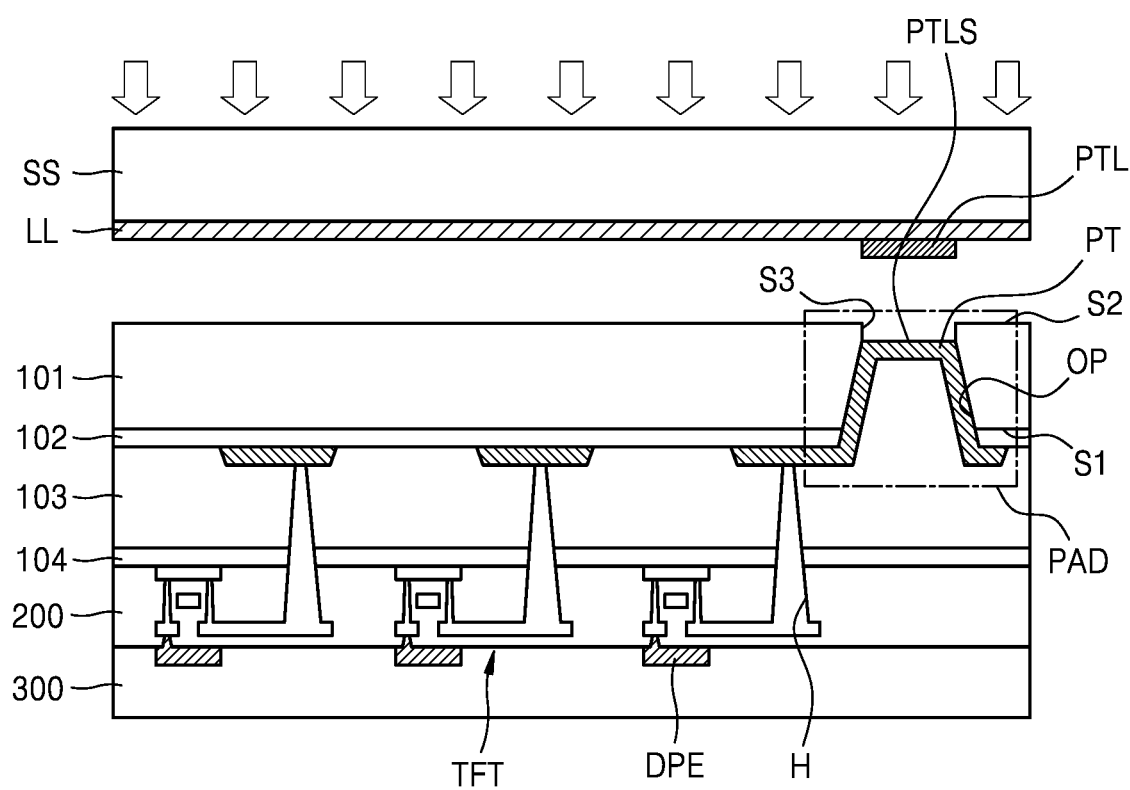

Referring to FIG. 15, the base layer 101 may be separated from the lower layer LL. The adhesive strength or adhesive force between the support substrate SS and the lower layer LL may be greater than the adhesive strength or adhesive force between the lower layer LL and the base layer 101. Accordingly, the base layer 101 may be separated from the support substrate SS and the lower layer LL.

In an embodiment, the base layer 101 and the lower layer LL may be separated according to a laser release method of irradiating a laser onto the base layer 101. The laser may be irradiated toward the second surface S2 of the base layer 101. As the laser, for example, an excimer laser having a wavelength of 308 nm, 343 nm, or an ultraviolet (UV) laser having a wavelength of 355 nm, and/or the like may be used. However, the present disclosure is not limited thereto, and the base layer 101 may be separated from the lower layer LL using various suitable methods.

The pattern layer PTL may be separated from the terminal PT. The adhesive strength or adhesive force between the pattern layer PTL and the lower layer LL may be greater than the adhesive strength or adhesive force between the pattern layer PTL and the terminal PT. Accordingly, when the pattern layer PTL is separated from the terminal PT, the third surface S3 may be exposed. In addition, the lower surface PTLS of the terminal PT may be exposed.

According to an embodiment of the present disclosure, the pattern layer PTL having an adhesive strength with the lower layer LL that is greater than that with the terminal PT may be formed on the lower layer LL. Accordingly, when the lower layer LL is separated with the base layer 101, the terminal PT may be separated from the pattern layer PTL.

In an embodiment, when a portion of the lower layer LL remains on the base layer 101, the lower layer LL may be removed by irradiating a laser. In another embodiment, when a portion of the lower layer LL remains on the base layer 101, the lower layer LL may be removed by etching. For example, the lower layer LL may be removed by a dry etching method using plasma.

Figure 16:
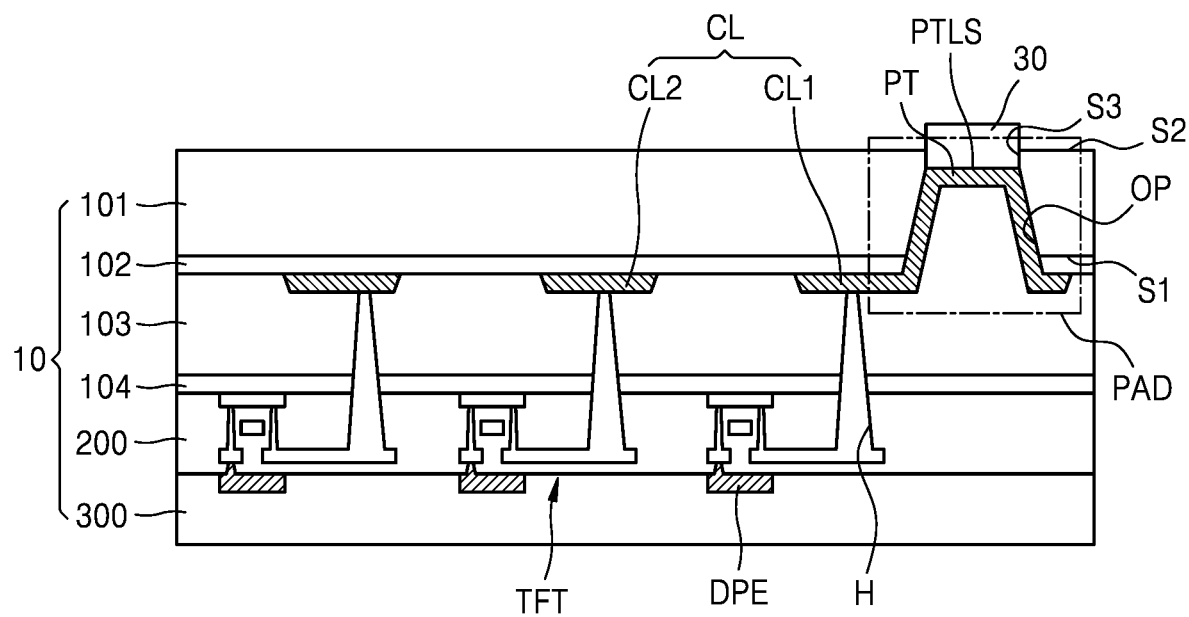

Referring to FIG. 16, the flexible printed circuit film 30 may be connected to the pad unit PAD. The flexible printed circuit film 30 may be connected (e.g., electrically connected) to the pad unit PAD. In an embodiment, the flexible printed circuit film 30 may be connected (e.g., electrically connected) to the terminal PT of the pad unit PAD.

Referring to FIG. 17A, the terminal PT of the pad unit PAD may be connected (e.g., electrically connected) to the circuit terminal 30T of the flexible printed circuit film 30. In an embodiment, the terminal PT of the pad unit PAD may be connected (e.g., electrically connected) to the circuit terminal 30T of the flexible printed circuit film 30 through the anisotropic conductive film ACF. In an embodiment, the anisotropic conductive film ACF may include the adhesive resin ADR and the plurality of conductive balls CDB.

In an embodiment, heat may be applied to at least one of the adhesive resin ADR or the plurality of conductive balls CDB.

In an embodiment, each of the terminal PT of the pad unit PAD and the circuit terminal 30T of the flexible printed circuit film 30 may be pressed toward the anisotropic conductive film ACF as shown in FIG. 17A.

Accordingly, the adhesive resin ADR may fix the plurality of conductive balls CDB in a certain area and physically connect the terminal PT of the pad unit PAD and the flexible printed circuit film 30. The plurality of conductive balls CDB may electrically connect the terminal PT of the pad unit PAD and the circuit terminal 30T of the flexible printed circuit film 30.

Referring to FIG. 17B, the terminal PT of the pad unit PAD may be connected (e.g., directly connected) to the flexible printed circuit film 30. For example, the terminal PT of the pad unit PAD may be connected (e.g., electrically connected) to the circuit terminal 30T of the flexible printed circuit film 30 through the melting portion MP. The melting portion MP may be an alloy including a portion of the terminal PT of the pad unit PAD and a portion of the circuit terminal 30T of the flexible printed circuit film 30.

In an embodiment, the terminal PT of the pad unit PAD and the circuit terminal 30T of the flexible printed circuit film 30 may be pressed and connected (e.g., directly connected) as shown in FIG. 17B. In this case, the portion of the terminal PT of the pad unit PAD and the portion of the circuit terminal 30T of the flexible printed circuit film 30 may be melted and bonded in the melting portion MP.

Referring to FIG. 18, the printed circuit board 20 may be connected to the flexible printed circuit film 30. The printed circuit board 20 may be arranged to face the second surface S2 of the base layer 101. In an embodiment, the printed circuit board 20 and the flexible printed circuit film 30 may be connected with an anisotropic conductive film therebetween, similar to the embodiment of FIG. 17A. In an embodiment, the printed circuit board 20 and the flexible printed circuit film 30 may be connected (e.g., directly connected), similar to the embodiment of FIG. 17B.

In an embodiment of the present disclosure, the terminal PT of the pad unit PAD may be separated from the support substrate SS and the pattern layer PTL, and the pattern layer PTL may prevent or reduce damage to the terminal PT of the pad unit PAD. In addition, the pattern layer PTL may prevent or substantially prevent the terminal PT of the pad unit PAD from being peeled off from the display panel 10. Accordingly, the pad unit PAD may smoothly receive signals and/or voltages from the flexible printed circuit film 30.

Figure 19:
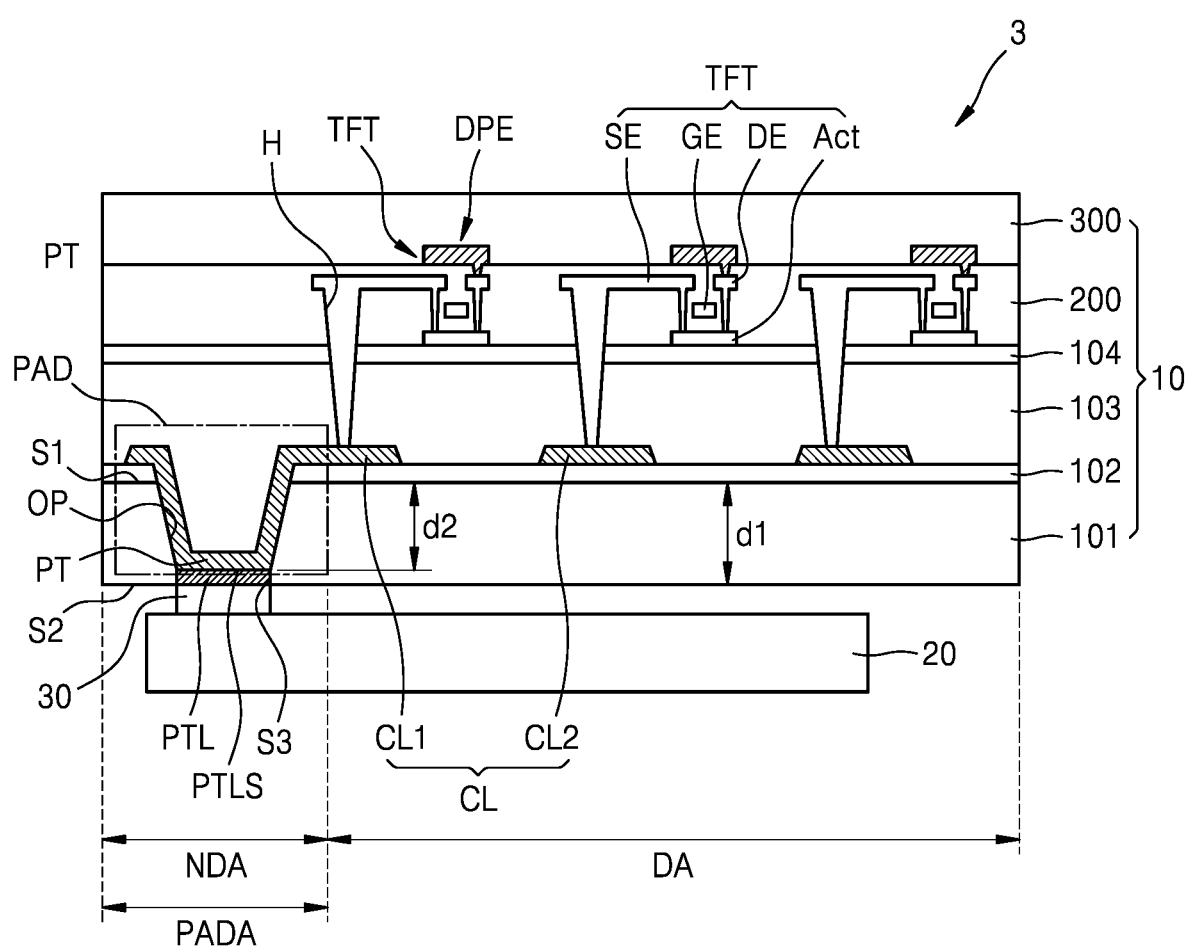
FIG. 19 is a schematic cross-sectional view of a display device according to an embodiment.

FIG. 19 is a schematic cross-sectional view of a display device 3 according to an embodiment. In FIG. 19, the same reference numerals as those in FIG. 2A refer to the same members, and redundant descriptions thereof may not be repeated. The embodiment described with reference to FIG. 19 is different from the embodiment described with reference to FIG. 2A in that the pattern layer PTL is further included.

Referring to FIG. 19, the display device 3 may include the display panel 10, the printed circuit board 20, the flexible printed circuit film 30, and the pattern layer PTL. The display panel 10 may display an image. The display panel 10 may include the base layer 101, the first barrier layer 102, the pad unit PAD, the connection line CL, the insulating layer 103, the second barrier layer 104, the pixel circuit layer 200, the display element DPE, and the protective layer 300.

The pattern layer PTL may be arranged between the terminal PT of the pad unit PAD and the flexible printed circuit film 30. In an embodiment, the pattern layer PTL may overlap the opening portion OP. In addition, the pattern layer PTL may overlap the third surface S3. The pattern layer PTL may be arranged on the lower surface PTLS of the terminal PT, and may be connected to the lower surface PTLS of the terminal PT. In an embodiment, a lower surface of the pattern layer PTL may substantially coincide with the second surface S2 of the base layer 101. For example, the lower surface of the pattern layer PTL may substantially align with or match the second surface S2 of the base layer 101.

In an embodiment, the pattern layer PTL may include a conductive material. For example, the pattern layer PTL may include a metal having conductivity, a non-metal having conductivity, and/or the like.

Because the pattern layer PTL includes a conductive material, the terminal PT of the pad unit PAD and the flexible printed circuit film 30 may be connected (e.g., electrically connected) through the pattern layer PTL. In addition, the pattern layer PTL may protect the terminal PT of the pad unit PAD.

When the pattern layer PTL is arranged between the terminal PT of the pad unit PAD and the flexible printed circuit film 30, the pattern layer PTL may be connected (e.g., electrically connected) to the flexible printed circuit film 30 through an anisotropic conductive film. Alternatively, at least a portion of the pattern layer PTL may be melted to be connected (e.g., directly connected) to the flexible printed circuit film 30.

Figure 20:
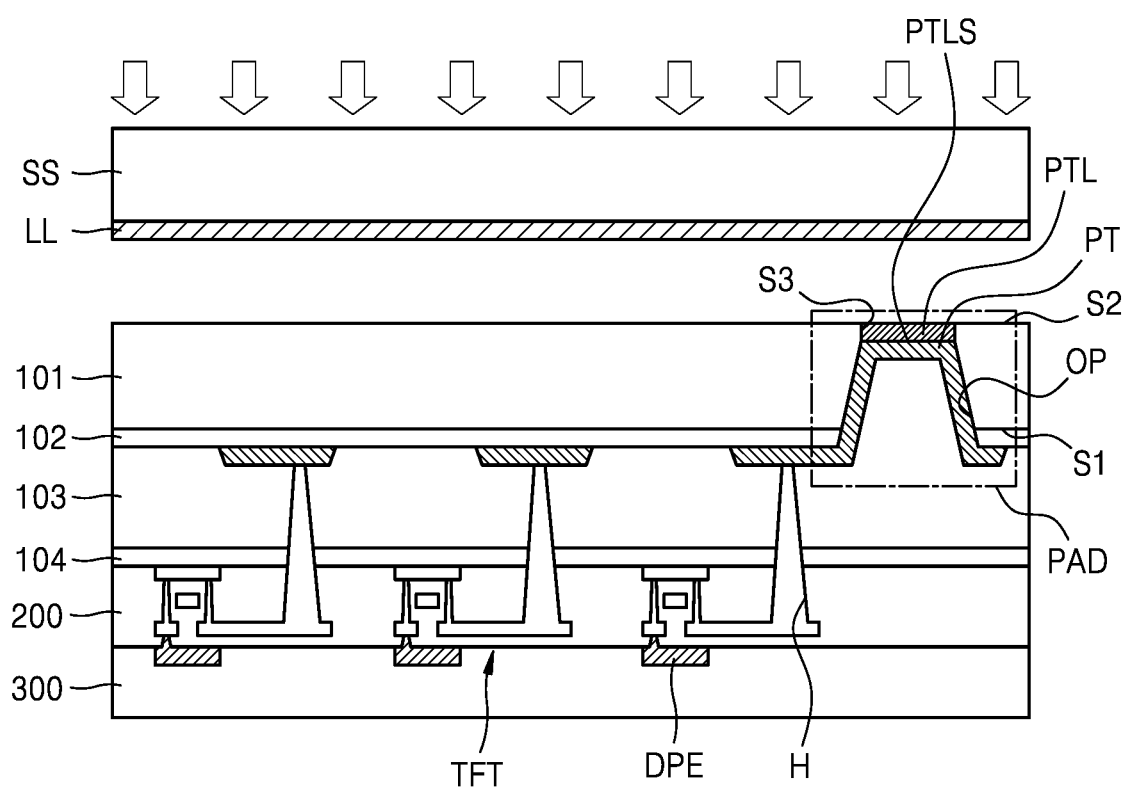
FIG. 20 is a cross-sectional view illustrating a method of manufacturing a display device according to another embodiment.

FIG. 20 is a cross-sectional view illustrating a method of manufacturing a display device according to another embodiment. In FIG. 20, the same reference numerals as those in FIG. 15 refer to the same members, and redundant descriptions thereof may not be repeated.

Referring to FIG. 20, the pattern layer PTL may be separated from the lower layer LL. In an embodiment, when the base layer 101 is separated from the lower layer LL, the pattern layer PTL may be separated from the lower layer LL.

When manufacturing the display device 3, the base layer 101 and the opening portion OP may be formed on the support substrate SS having a relative rigidity. In addition, the terminal PT of the pad unit PAD may be formed in the opening portion OP. The pattern layer PTL may prevent the terminal PT of the pad unit PAD from contacting the lower layer LL, and when the base layer 101 is separated from the lower layer LL, the pattern layer PTL may be separated from the lower layer LL and prevent or reduce damage to the terminal PT of the pad unit PAD. In addition, the pattern layer PTL may prevent or substantially prevent the terminal PT of the pad unit PAD from being peeled off.

The pattern layer PTL may be connected to a flexible printed circuit film. In an embodiment, a circuit terminal of the flexible printed circuit film may be connected (e.g., directly connected) to the pattern layer PTL. In one or more embodiments, a portion of the circuit terminal of the flexible printed circuit film and a portion of the pattern layer PTL may be melted. In another embodiment, the circuit terminal of the flexible printed circuit film may be connected (e.g., electrically connected) to the pattern layer PTL through an anisotropic conductive film.

Figure 21:
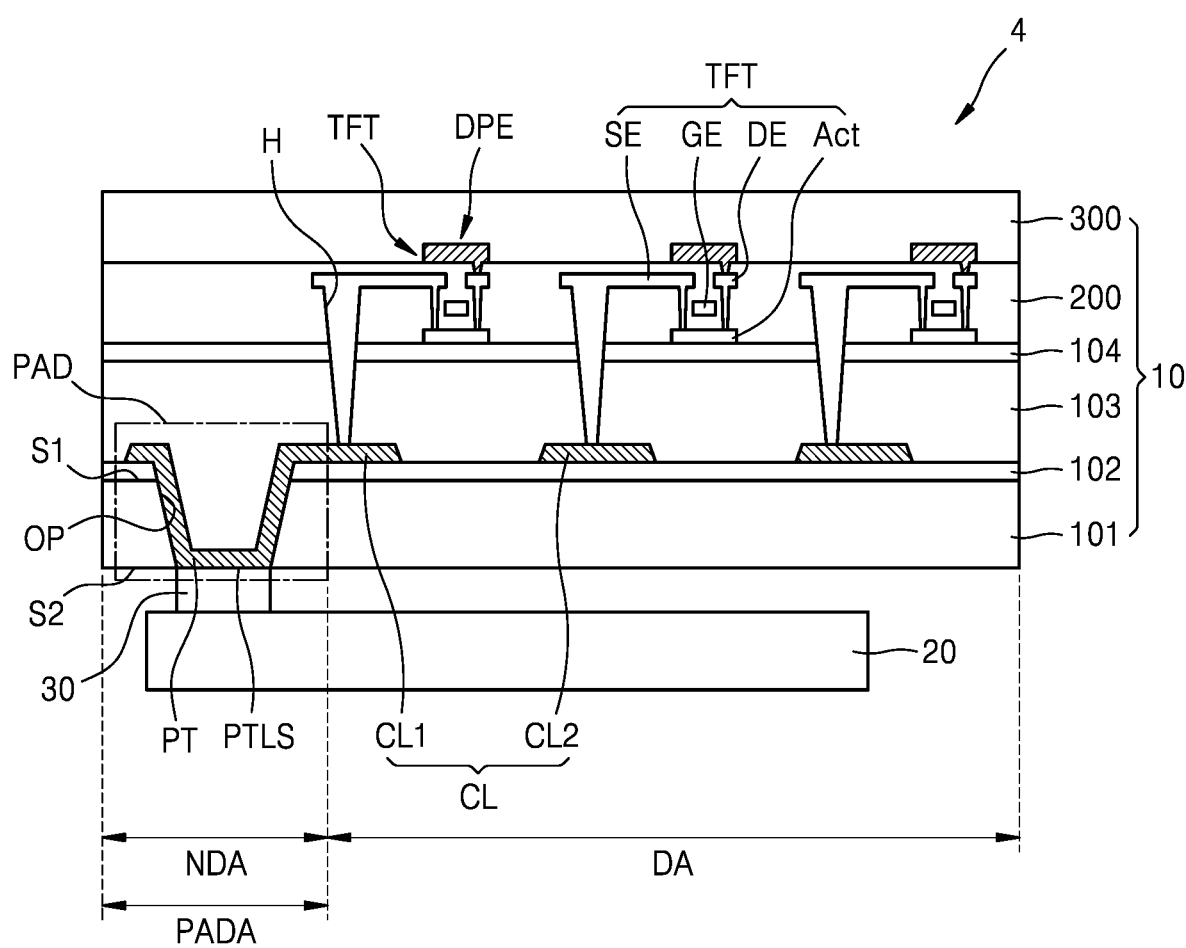
FIG. 21 is a schematic cross-sectional view of a display device according to an embodiment.

FIG. 21 is a schematic cross-sectional view of a display device 4 according to an embodiment. In FIG. 21, the same reference numerals as those in FIG. 2A refer to the same members, and redundant descriptions thereof may not be repeated.

Referring to FIG. 21, the display device 4 may include the display panel 10, the printed circuit board 20, and the flexible printed circuit film 30. The display panel 10 may display an image. The display panel 10 may include the base layer 101, the first barrier layer 102, the pad unit PAD, the connection line CL, the insulating layer 103, the second barrier layer 104, the pixel circuit layer 200, the display element DPE, and the protective layer 300. In some embodiments, at least one of the first barrier layer 102 or the second barrier layer 104 may be omitted.

The pad unit PAD may include the terminal PT, and the terminal PT may be connected (e.g., electrically connected) to the flexible printed circuit film 30. The terminal PT may be arranged on the first surface S1. The terminal PT may overlap the opening portion OP. The terminal PT may extend through the opening portion OP. In an embodiment, the lower surface PTLS of the terminal PT may substantially coincide with the second surface S2 of the base layer 101. For example, the lower surface PTLS of the terminal PT may substantially align with or match the second surface S2 of the base layer 101.

FIGS. 22A-22D are cross-sectional views illustrating a method of manufacturing a display device according to another embodiment. In FIGS. 22A-22D, the same reference numerals as those in FIGS. 8, 10, 11, and 15 refer to the same members, and redundant descriptions thereof may not be repeated.

Figure 22A:
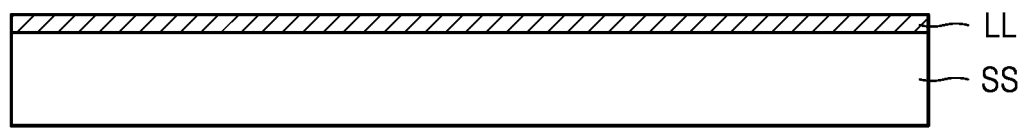
FIGS. 22A-22D are cross-sectional views illustrating a method of manufacturing a display device according to another embodiment.

Referring to FIG. 22A, the lower layer LL may be formed on the support substrate SS. The lower layer LL may include a material that is, in an operation of separating a base layer and/or a terminal from the support substrate SS to be described in more detail below, easy to detach (e.g., detach the base layer and/or the terminal from the support substrate SS). The adhesive strength between the lower layer LL and the support substrate SS may be greater than the adhesive strength between the lower layer LL and the base layer and/or the terminal. The lower layer LL may include at least one of a-Si, Poly-Si, Crystalline-Si, ZnO, or IZO.

Figure 22B:
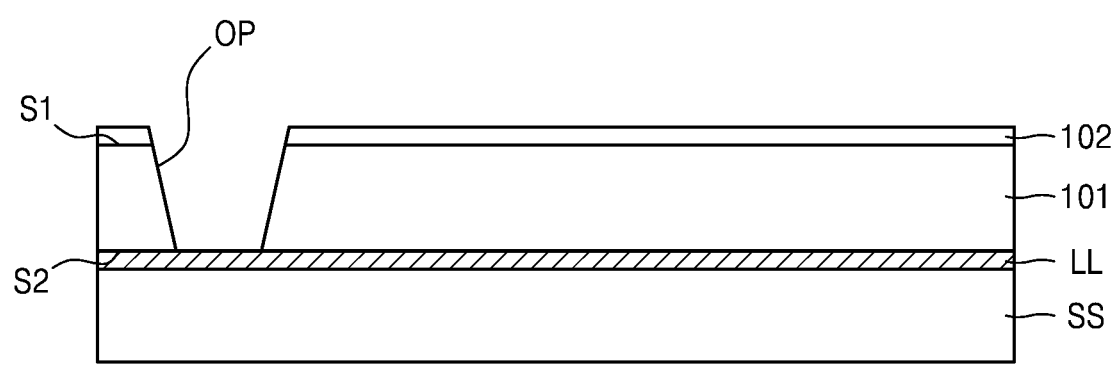

Referring to FIG. 22B, the base layer 101 may be formed on the lower layer LL. The base layer 101 may cover the lower layer LL. The base layer 101 may include the first surface S1 and the second surface S2 opposite to the first surface S1. The second surface S2 may face the lower layer LL. In an embodiment, the first barrier layer 102 may be formed on the base layer 101. The first barrier layer 102 may face the first surface S1 of the base layer 101. In some embodiments, an operation of forming the first barrier layer 102 may be omitted.

The opening portion OP may be formed in the base layer 101. The opening portion OP may penetrate the first surface S1 and the second surface S2. In an embodiment, the base layer 101 may be etched to form the opening portion OP. For example, the base layer 101 may be dry-etched to form the opening portion OP.

The opening portion OP may expose a portion of the lower layer LL. When the first barrier layer 102 is arranged on the base layer 101, an opening portion exposing a portion of the lower layer LL may also be formed in the first barrier layer 102.

Figure 22C:
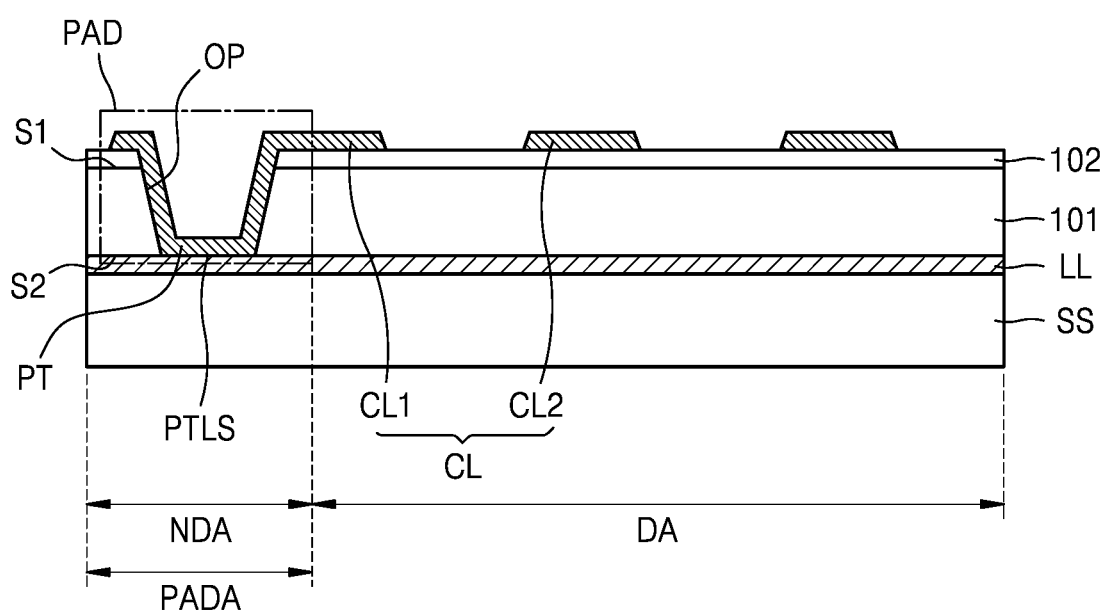

Referring to FIG. 22C, the pad unit PAD including the terminal PT may be formed. The terminal PT may be formed on the first surface S1. In an embodiment, the terminal PT may be formed on the first barrier layer 102. The terminal PT may overlap the opening portion OP. The terminal PT may extend in a direction from the first surface S1 to the second surface S2 through the opening portion OP.

The lower surface PTLS of the terminal PT may substantially coincide with the second surface S2 of the base layer 101. For example, the lower surface PTLS of the terminal PT may substantially align with or match the second surface S2 of the base layer 101. In this case, at least a portion of the terminal PT may be in contact with lower layer LL.

The connection line CL may be formed above the base layer 101. In an embodiment, the connection line CL may be formed on the first barrier layer 102. The connection line CL may be connected to the pad unit PAD. In an embodiment, the connection line CL may be connected to the terminal PT of the pad unit PAD. In an embodiment, the connection line CL may be integrally formed with the terminal PT. In an embodiment, the connection line CL may be concurrently (e.g., simultaneously) formed with the terminal PT of the pad unit PAD.

Figure 22D:
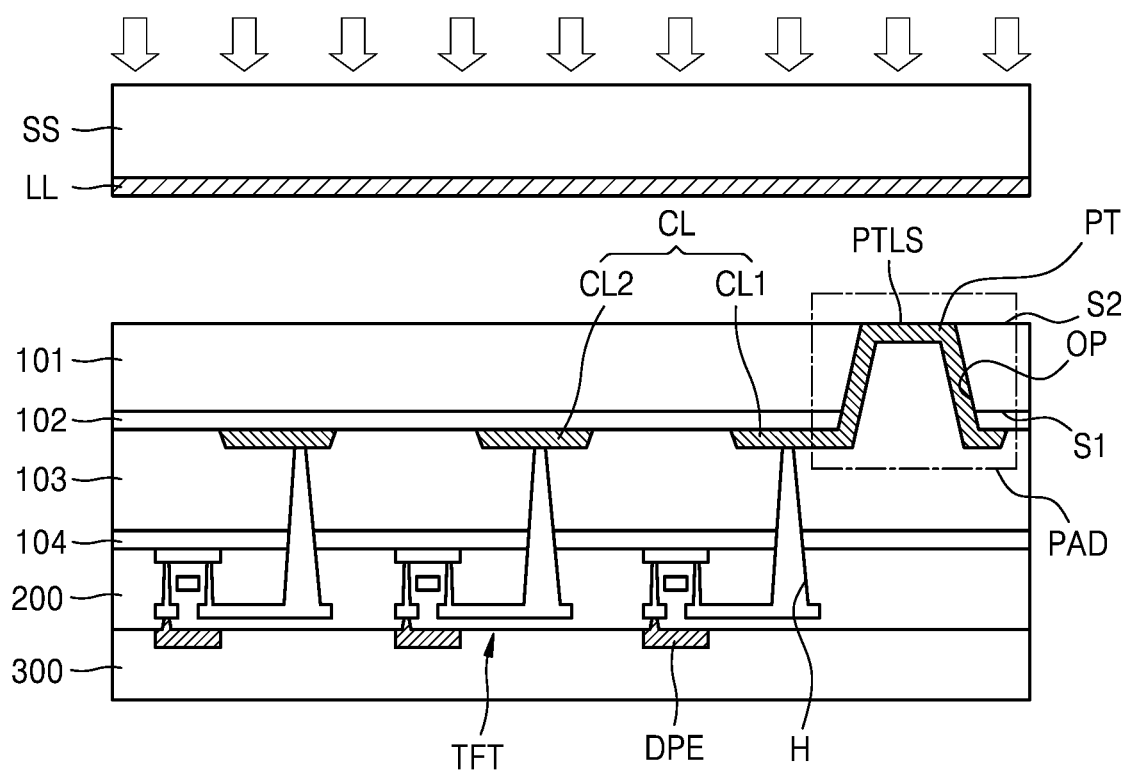

Referring to FIG. 22D, the insulating layer 103 may be formed. The insulating layer 103 may cover the terminal PT and the connection line CL. In an embodiment, the second barrier layer 104 may be formed on the insulating layer 103. In some embodiments, an operation of forming the second barrier layer 104 may be omitted.

Next, the pixel circuit layer 200 may be formed above the insulating layer 103. The pixel circuit layer 200 may include at least one thin-film transistor TFT.

Then, the display element DPE may be formed on the pixel circuit layer 200. The plurality of display elements DPE may be formed on the pixel circuit layer 200. The display element DPE may be connected to the thin-film transistor TFT.

Then, the protective layer 300 may be formed on the display element DPE. The protective layer 300 may protect the display element DPE.

Next, the base layer 101 may be separated from the lower layer LL. The adhesive strength or adhesive force between the support substrate SS and the lower layer LL may be greater than the adhesive strength or adhesive force between the lower layer LL and the base layer 101. Accordingly, the base layer 101 may be separated from the support substrate SS and the lower layer LL.

The lower surface PTLS of the terminal PT overlapping the opening portion OP may be exposed. In an embodiment, the lower layer LL may be separated from the terminal PT. The adhesive strength or adhesive force between the support substrate SS and the lower layer LL may be greater than the adhesive strength or adhesive force between the lower layer LL and the terminal PT. Accordingly, when the lower layer LL is separated from the terminal PT, the lower surface PTLS of the terminal PT may be exposed.

In an embodiment, when a portion of the lower layer LL remains on the base layer 101, the lower layer LL may be removed by irradiating a laser. In another embodiment, when a portion of the lower layer LL remains on the base layer 101, the lower layer LL may be removed by etching. For example, the lower layer LL may be removed by a dry etching method using plasma.

Figure 23:
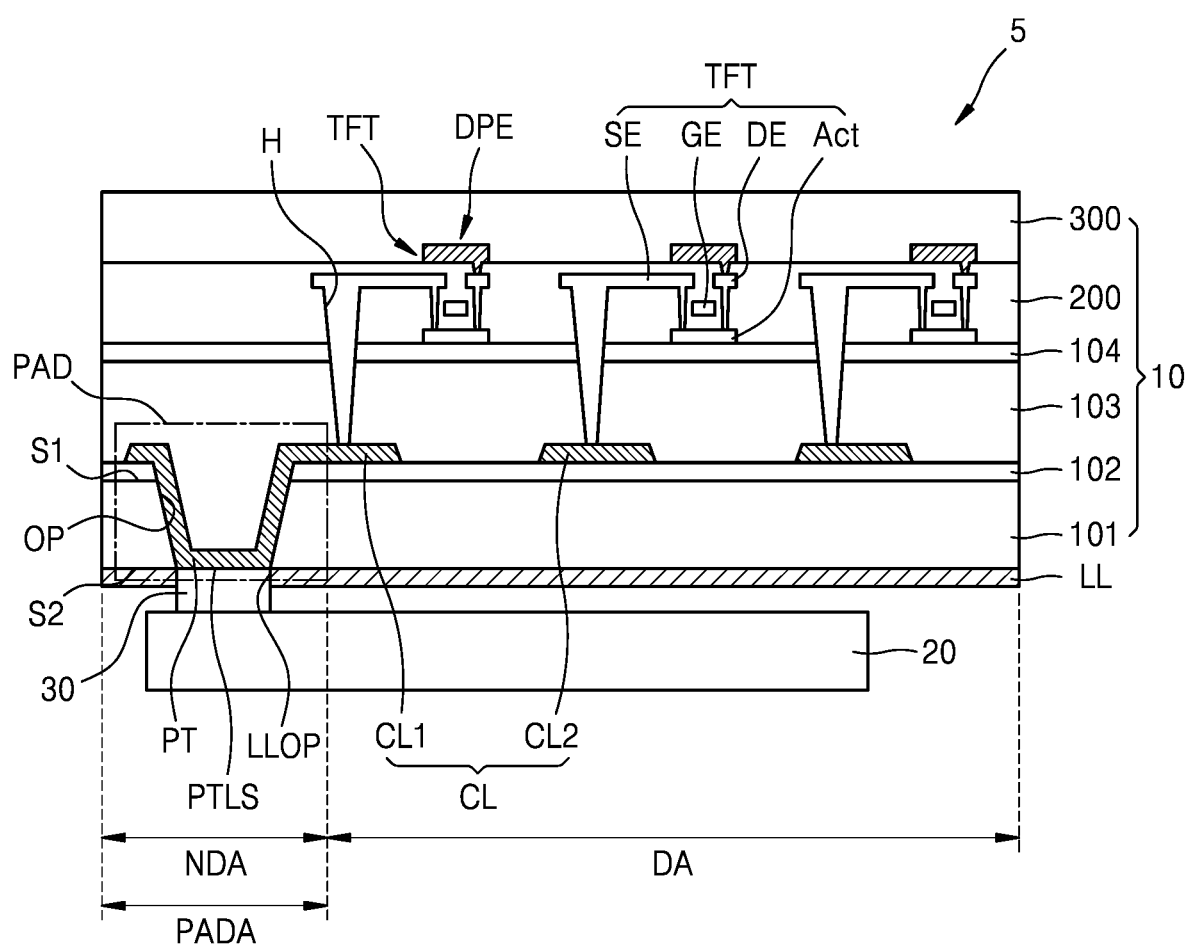
FIG. 23 is a schematic cross-sectional view of a display device according to an embodiment.

FIG. 23 is a schematic cross-sectional view of a display device 5 according to an embodiment. In FIG. 23, the same reference numerals as those in FIG. 2A refer to the same members, and redundant descriptions thereof may not be repeated. The embodiment described with reference to FIG. 23 is different from the embodiment described with reference to FIG. 21 in that the lower layer LL is further included.

Referring to FIG. 23, the display device 5 may include the display panel 10, the printed circuit board 20, the flexible printed circuit film 30, and the lower layer LL. The display panel 10 may display an image. The display panel 10 may include the base layer 101, the first barrier layer 102, the pad unit PAD, the connection line CL, the insulating layer 103, the second barrier layer 104, the pixel circuit layer 200, the display element DPE, and the protective layer 300. In some embodiments, at least one of the first barrier layer 102 or the second barrier layer 104 may be omitted. In some embodiments, the display device 5 may further include a pattern layer arranged between the terminal PT of the pad unit PAD and the flexible printed circuit film 30 and including a conductive material.

The lower layer LL may be arranged on the second surface S2 of the base layer 101. Although the lower layer LL is illustrated as being entirely arranged on the second surface S2 of the base layer 101 in FIG. 23, the lower layer LL may be arranged only on a portion of the second surface S2.

The lower layer LL may have a lower opening portion LLOP overlapping the opening portion OP. The lower opening portion LLOP may expose the lower surface PTLS of the terminal PT. Accordingly, the flexible printed circuit film 30 may be connected to the pad unit PAD through the lower opening portion LLOP.

The lower layer LL may include at least one of a-Si, Poly-Si, Crystalline-Si, ZnO, or IZO. However, the present disclosure is not limited thereto.

Figure 24A:
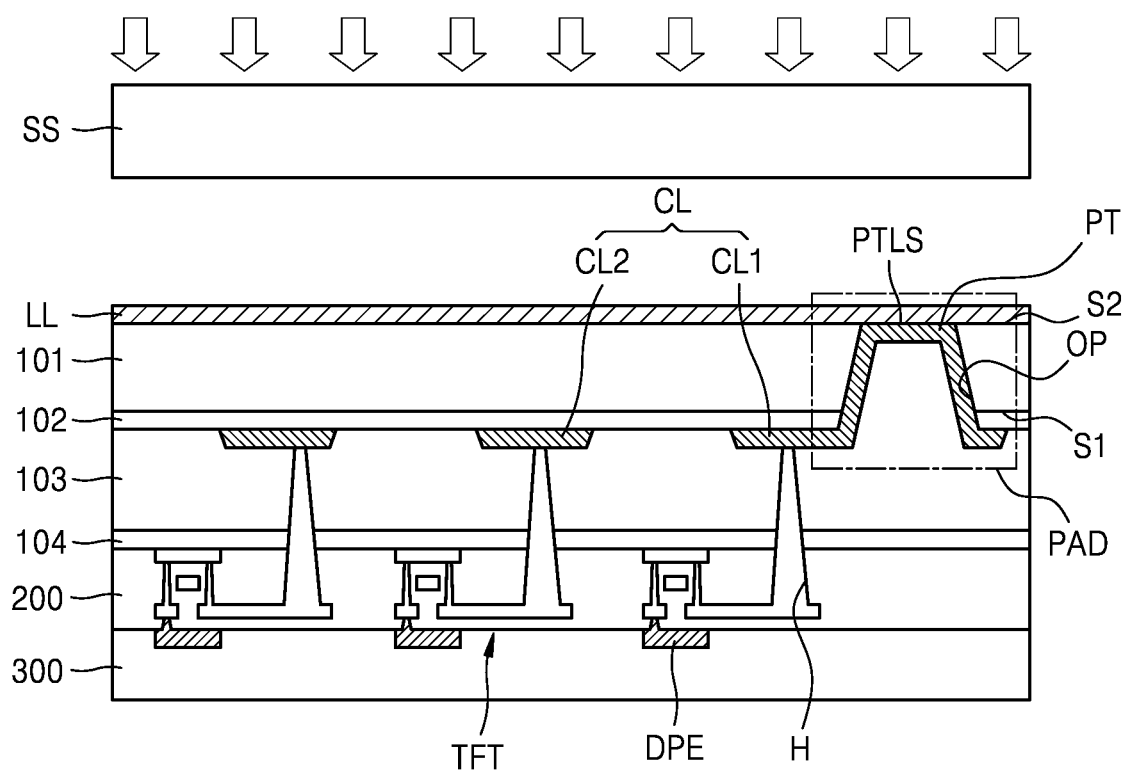
FIGS. 24A and 24B are cross-sectional views illustrating a method of manufacturing a display device according to another embodiment.
Figure 24B:
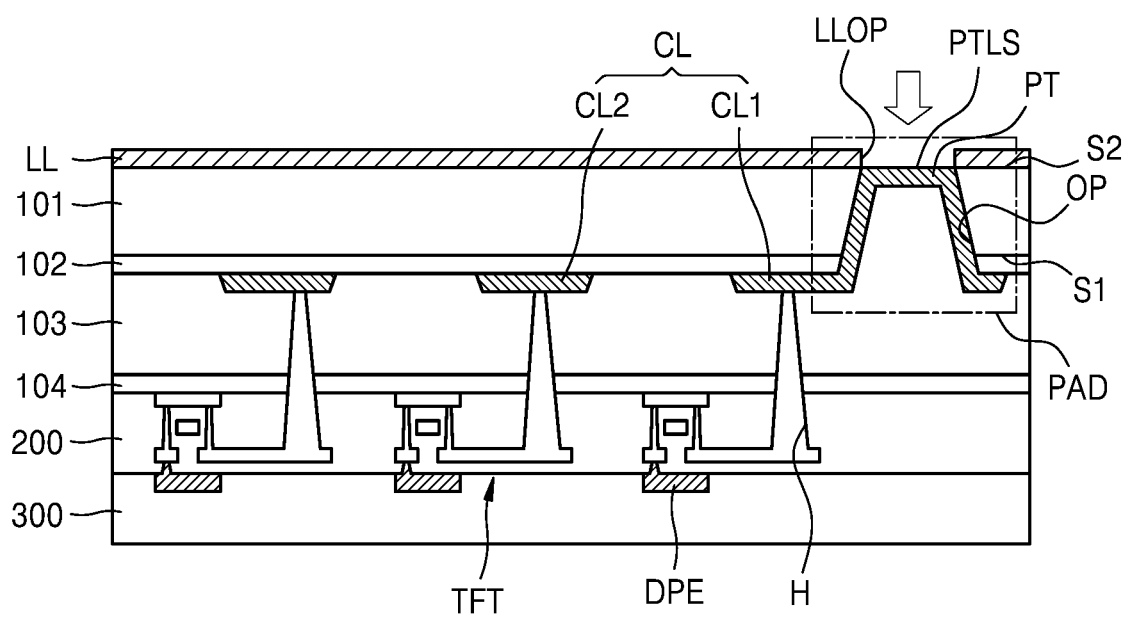

FIGS. 24A and 24B are cross-sectional views illustrating a method of manufacturing a display device according to another embodiment. In FIGS. 24A and 24B, the same reference numerals as those in FIGS. 22A-22D refer to the same members, and redundant descriptions thereof may not be repeated.

Referring to FIG. 24A, the base layer 101 may be separated from the support substrate SS. In an embodiment, the lower layer LL may be at least partially separated from the support substrate SS. The adhesive strength or adhesive force between the support substrate SS and the lower layer LL may be less than the adhesive strength or adhesive force between the lower layer LL and the base layer 101. Accordingly, the base layer 101 and at least a portion of the lower layer LL may be separated from the support substrate SS.

Next, the lower surface PTLS of the terminal PT overlapping the opening portion OP may be exposed. In an embodiment, the lower opening portion LLOP overlapping the opening portion OP may be formed in the lower layer LL. In an embodiment, the display device being manufactured may be arranged on a carrier substrate, and the lower opening portion LLOP overlapping the opening portion OP may be formed in the lower layer LL. In another embodiment, the display device being manufactured may be fixed to a plate, and the lower opening portion LLOP overlapping the opening portion OP may be formed in the lower layer LL.

The lower opening portion LLOP may be formed by irradiating the lower layer LL with a laser. As another example, the lower opening portion LLOP may be formed by etching the lower layer LL. The lower opening portion LLOP may be formed by performing a dry etching method using plasma on the lower layer LL. Accordingly, when at least a portion of the lower layer LL remains on the base layer 101, the lower opening portion LLOP overlapping the opening portion OP may be formed in the lower layer LL to expose the terminal PT.

As described above, embodiments of the present disclosure may include a terminal extending through an opening portion penetrating a first surface of a base layer and a second surface of the base layer. Accordingly, embodiments of the present disclosure may reduce a non-display area by arranging a printed circuit board on the second surface of the base layer.

In addition, embodiments of the present disclosure may prevent or substantially prevent peeling off of the terminal between operations by forming a lower layer on a support substrate.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and equivalents thereof.

What is claimed is:

1. A display device comprising a display area and a non-display area, the display device further comprising:
   a base layer comprising a first surface and a second surface opposite to the first surface, the base layer having, in the non-display area, an opening portion penetrating the first surface and the second surface;
   a pad unit comprising a terminal on the first surface of the base layer, the terminal extending from the first surface of the base layer to the opening portion, and forming at least one side of the opening portion;
   a connection line connected to the terminal on the first surface, the connection line extending from the non-display area to the display area;
   an insulating layer covering the terminal and the connection line;
   a thin-film transistor comprising a semiconductor layer on the insulating layer, the thin-film transistor being connected to the connection line; and
   a display element connected to the thin-film transistor, the display element being in the display area,
   wherein the first surface of the base layer faces the display element, and
   wherein the insulating layer is located between the connection line and the semiconductor layer, and fills the opening portion.

2. The display device of claim 1, wherein the thin-film transistor further comprises a gate electrode overlapping the semiconductor layer, a source electrode connected to the semiconductor layer, and a drain electrode connected to the semiconductor layer,
  wherein, in the display area, the connection line is connected to at least one of the gate electrode, the source electrode, or the drain electrode.

3. The display device of claim 1, further comprising a middle connection pattern on the insulating layer,
  wherein, in the display area, the middle connection pattern is connected to the connection line through a contact hole in the insulating layer, and
  wherein the thin-film transistor is connected to the middle connection pattern.

4. The display device of claim 1, further comprising a first thin-film transistor comprising polysilicon and a second thin-film transistor comprising an oxide semiconductor,
  wherein the thin-film transistor is the first thin-film transistor or the second thin-film transistor.

5. The display device of claim 1, wherein each of the insulating layer and the base layer comprises a polymer resin.

6. The display device of claim 1, wherein a first distance from the first surface to the second surface is greater than a second distance from the first surface to a lower surface of the terminal overlapping the opening portion.

7. The display device of claim 6, further comprising a pattern layer overlapping the opening portion, the pattern layer being on the lower surface of the terminal.

8. The display device of claim 1, wherein a lower surface of the terminal coincides with the second surface.

9. The display device of claim 1, further comprising a barrier layer between the insulating layer and the base layer.

10. The display device of claim 1, further comprising a lower layer on the second surface, the lower layer having a lower opening portion overlapping the opening portion.

11. The display device of claim 1, further comprising:
  a printed circuit board on the second surface; and
  a flexible printed circuit film overlapping the opening portion, the flexible printed circuit film connecting the printed circuit board and the pad unit.

* * * * *